United States Patent
Moue et al.

(10) Patent No.: US 11,962,927 B2
(45) Date of Patent: Apr. 16, 2024

(54) SOLID-STATE IMAGE SENSOR

(71) Applicant: Sony Semiconductor Solutions Corporation, Kanagawa (JP)

(72) Inventors: Takashi Moue, Kanagawa (JP); Yosuke Ueno, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/195,114

(22) Filed: May 9, 2023

(65) Prior Publication Data
US 2023/0336893 A1 Oct. 19, 2023

Related U.S. Application Data

(63) Continuation of application No. 17/430,842, filed as application No. PCT/JP2019/044753 on Nov. 14, 2019, now Pat. No. 11,729,533.

(30) Foreign Application Priority Data

Feb. 21, 2019 (JP) ................. 2019-028965

(51) Int. Cl.
*H04N 25/772* (2023.01)
*H04N 25/57* (2023.01)
*H04N 25/709* (2023.01)
*H04N 25/75* (2023.01)

(52) U.S. Cl.
CPC .......... *H04N 25/772* (2023.01); *H04N 25/57* (2023.01); *H04N 25/709* (2023.01); *H04N 25/75* (2023.01)

(58) Field of Classification Search
None
See application file for complete search history.

(56) References Cited

U.S. PATENT DOCUMENTS

| 2013/0206961 | A1  | 8/2013 | Ikeda et al. |
| 2017/0118430 | A1* | 4/2017 | Koifman ............. H04N 25/772 |
| 2018/0035062 | A1  | 2/2018 | Tsukida et al. |
| 2018/0103222 | A1  | 4/2018 | Yan |

FOREIGN PATENT DOCUMENTS

| EP | 2 924 980 A1  | 9/2015 |
| EP | 3 076 663 A2  | 10/2016 |
| JP | 2010187239 A  | 8/2010 |
| JP | 2012147339 A  | 8/2012 |
| JP | 2015195570 A  | 11/2015 |
| JP | 2016192594 A  | 11/2016 |
| JP | 2018019354 A  | 2/2018 |
| JP | 2018148541 A  | 9/2018 |

OTHER PUBLICATIONS

International Search Report (PCT/ISA/210), International Application No. PCT/JP2019/044753, dated Jan. 31, 2020.

* cited by examiner

*Primary Examiner* — Mark T Monk
(74) *Attorney, Agent, or Firm* — Michael Best & Friedrich LLP

(57) ABSTRACT

A solid-state image sensor includes: an input transistor configured to output, from a drain, a drain voltage according to an input voltage input to a source in a case where the input voltage substantially coincides with a predetermined reference voltage input to a gate; and an output transistor configured to output a signal indicating whether or not a difference between the input voltage input to a source and the drain voltage input to a gate exceeds a predetermined threshold voltage as a comparison result between the input voltage and the reference voltage.

27 Claims, 31 Drawing Sheets

SOLID-STATE IMAGE SENSOR

CROSS REFERENCE TO RELATED APPLICATIONS

The present Application is a Continuation Application of U.S. patent application Ser. No. 17/430,842 filed Aug. 13, 2021, which is a 371 National Stage Entry of International Application No.: PCT/JP2019/044753, filed on Nov. 14, 2019, which in turn claims the benefit of Japanese Priority Patent Application JP 2019-028965 filed on Feb. 21, 2019, the entire contents of which are incorporated herein by reference.

TECHNICAL FIELD

The present technology relates to a solid-state image sensor. Specifically, the present technology relates to a solid-state image sensor that performs analog-digital conversion using a comparator.

BACKGROUND ART

Single slope analog to digital converters (ADCs) have been used for analog to digital (AD) conversion in solid-state image sensors or the like because of its simple structures. This single slope ADC is generally configured by a comparator and a counter that performs counting on the basis of a comparison result of the comparator. For example, a solid-state image sensor has been proposed, which has a p-channel metal-oxide-semiconductor (pMOS) transistor and an inverter arranged in the comparator, the pMOS transistor having a pixel signal input to a source and a reference signal input to a gate (for example, see PTL 1). This pMOS transistor outputs a drain voltage thereof to the counter via the inverter as a comparison result of the pixel signal and the reference signal.

CITATION LIST

Patent Literature

PTL 1

US 2018/0103222 A

SUMMARY

Technical Problem

In the above-described solid-state image sensor, the comparator shares a power supply of a pixel circuit, thereby reducing power consumption, as compared with a configuration having a power supply in the comparator separately from the pixel circuit. However, in a connection configuration of the above-described solid-state image sensor, the drain voltage of the pMOS transistor varies according to a level of the pixel signal when the pixel signal substantially coincides with the reference signal. For this reason, timing when the comparison result is inverted may be shifted from ideal timing when the pixel signal substantially coincides with the reference signal. There is a problem that an error or non-linearity occurs in a digital signal obtained by AD conversion of the pixel signal due to this inversion timing error, and image quality of image data is degraded.

The present technology has been made in view of the foregoing, and it is desirable to suppress an error in inversion timing of a comparison result in a solid-state image sensor that compares a reference signal and a pixel signal.

Solution to Problem

According to an embodiment of the present technology, there is provided an imaging device comprising: a pixel circuit configured to output a pixel signal; a pixel signal line coupled to the pixel circuit; a reference signal generation circuit configured to output a reference signal; and a comparator including: a first transistor, wherein a gate of the first transistor is coupled to the reference signal generation circuit and a source of the first transistor is coupled to the pixel signal line, and a second transistor, wherein a gate of the first transistor is coupled to a drain of the first transistor and a source of the second transistor is electrically connected to the pixel signal line.

Furthermore, in the embodiment, the source of the first transistor and the source of the second transistor may be configured to receive a voltage, the voltage corresponding to the pixel signal.

Furthermore, in the embodiment, the comparator may include a third transistor, wherein a drain of the third transistor is coupled to the pixel signal line and a source of the third transistor is coupled to the drain of the first transistor.

Furthermore, in the embodiment, a gate of the third transistor may be configured to receive a bias voltage.

Furthermore, in the embodiment, the comparator may include a third transistor, wherein a gate of the third transistor is coupled to the drain of the first transistor and a source of the third transistor is coupled to the pixel signal line.

Furthermore, in the embodiment, the gate of the third transistor may be coupled to a drain of the third transistor.

Furthermore, in the embodiment, a bottom gate of the third transistor may be coupled to the source of the third transistor.

Furthermore, in the embodiment, the comparator may include a fourth transistor, wherein a drain of the fourth transistor is coupled to the pixel signal line and a source of the fourth transistor is coupled to a drain of the second transistor.

Furthermore, in the embodiment, a gate of the fourth transistor may be configured to receive a bias voltage.

Furthermore, in the embodiment, a bottom gate of the first transistor may be connected to the source of the first transistor and a bottom gate of the second transistor may be connected to the source of the second transistor.

Furthermore, in the embodiment, the pixel may be disposed in a first substrate and the comparator may be disposed in a second substrate which is bonded to the first substrate.

Furthermore, in the embodiment, the first substrate and the second substrate may be electrically connected by a through silicon via.

Furthermore, in the embodiment, the first substrate and the second substrate may be electrically connected by a direct bonding.

According to another embodiment of the present technology, there is provided a comparator comprising: a first input configured to receive a pixel signal; a second input configured to receive a reference signal; a first transistor, wherein a gate of the first transistor is coupled to the reference signal generation circuit and a source of the first transistor is coupled to the first input; and a second transistor, wherein a gate of the first transistor is coupled to a drain of the first transistor and a source of the second transistor is electrically connected to the first input.

Furthermore, in the embodiment, the source of the first transistor and the source of the second transistor may be configured to receive a voltage, the voltage corresponding to the pixel signal.

Furthermore, in the embodiment, the comparator may include a third transistor, wherein a drain of the third transistor is coupled to the pixel signal line and a source of the third transistor is coupled to the drain of the first transistor.

Furthermore, in the embodiment, a gate of the third transistor may be configured to receive a bias voltage.

Furthermore, in the embodiment, the comparator may include a third transistor, wherein a gate of the third transistor is coupled to the drain of the first transistor and a source of the third transistor is coupled to the first input.

Furthermore, in the embodiment, the gate of the third transistor may be coupled to a drain of the third transistor.

Furthermore, in the embodiment, a bottom gate of the third transistor may be coupled to the source of the third transistor.

Furthermore, in the embodiment, the comparator may include a fourth transistor, wherein a drain of the fourth transistor is coupled to the first input and a source of the fourth transistor is coupled to a drain of the second transistor.

Furthermore, in the embodiment, a gate of the fourth transistor may be configured to receive a bias voltage.

Furthermore, in the embodiment, a bottom gate of the fourth transistor may be connected to the source of the first transistor and a bottom gate of the second transistor may be connected to the source of the second transistor.

DESCRIPTION OF EMBODIMENTS

Hereinafter, modes for implementing the present technology (hereinafter referred to as embodiments) will be described. Description will be given according to the following order.

1. First Embodiment (an example of supplying a drain-source voltage to an output transistor)
2. Second Embodiment (an example of supplying a drain-source voltage to an output transistor and providing a clamp transistor on an input side)
3. Third Embodiment (an example of supplying a drain-source voltage to an output transistor and self-setting a gate voltage of a current source transistor)
4. Fourth Embodiment (an example of supplying a drain-source voltage to a cascode-connected output transistor) Fifth Embodiment (an example of supplying a drain-source voltage to an output transistor and providing an auto-zero switch on an output side)
6. Sixth Embodiment (an example of supplying a drain-source voltage to an output transistor and adding a logic gate at a subsequent stage)
7. Seventh Embodiment (an example of supplying a drain-source voltage to an output transistor and providing a two-stage clamp transistor)
8. Eighth Embodiment (an example of supplying a drain-source voltage to an output transistor and adding a current source)
9. Ninth Embodiment (an example of supplying a drain-source voltage to an output transistor and providing an N-type clamp transistor) Tenth Embodiment (an example of supplying a drain-source voltage to an output transistor and providing a buffer)
11. Eleventh Embodiment (an example of supplying a drain-source voltage to an output transistor and providing a clamp transistor on an output side)
12. Twelfth Embodiment (an example of supplying a drain-source voltage to an output transistor and providing a clamp switch)
13. Thirteenth Embodiment (an example of supplying a drain-source voltage to an output transistor and providing a resistive element)
14. Application to Moving Body

1. First Embodiment

Configuration Example of Imaging Device

Figure 1:
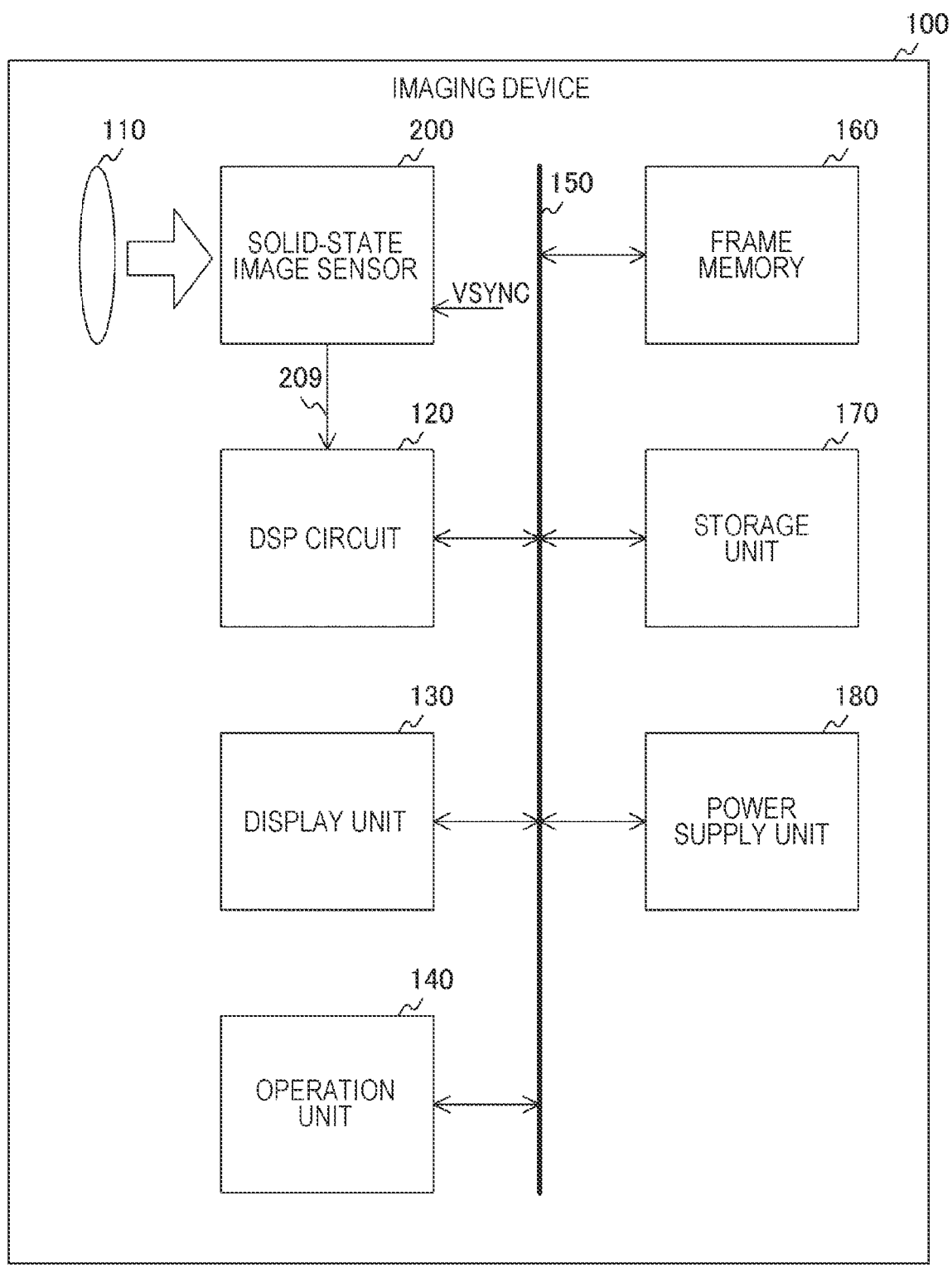
FIG. 1 is a block diagram illustrating a configuration example of an imaging device according to a first embodiment of the present technology.

FIG. 1 is a block diagram illustrating a configuration example of an imaging device 100 according to a first embodiment of the present technology. The imaging device 100 is a device for imaging image data, and includes an optical unit 110, a solid-state image sensor 200, and a digital signal processing (DSP) circuit 120. Moreover, the imaging device 100 includes a display unit 130, an operation unit 140, a bus 150, a frame memory 160, a storage unit 170, and a power supply unit 180. As the imaging device 100, a camera mounted on a smartphone, an in-vehicle camera, or the like is assumed.

The optical unit 110 condenses light from an object and guides the light to the solid-state image sensor 200. The solid-state image sensor 200 generates image data by photoelectric conversion. The solid-state image sensor 200 supplies the generated image data to the DSP circuit 120 via a signal line 209.

The DSP circuit 120 executes predetermined signal processing for the image data. The DSP circuit 120 outputs the processed image data to the frame memory 160 or the like via the bus 150.

The display unit 130 displays the image data. As the display unit 130, for example, a liquid crystal panel or an organic electro luminescence (EL) panel is assumed. The operation unit 140 generates an operation signal according to a user operation.

The bus 150 is a common path for the optical unit 110, the solid-state image sensor 200, the DSP circuit 120, the display unit 130, the operation unit 140, the frame memory 160, the storage unit 170, and the power supply unit 180 to exchange data with one another.

The frame memory 160 holds image data. The storage unit 170 stores various data such as image data. The power supply unit 180 supplies power to the solid-state image sensor 200, the DSP circuit 120, the display unit 130, and the like.

Configuration Example of Solid-State Image Sensor

Figure 2A:
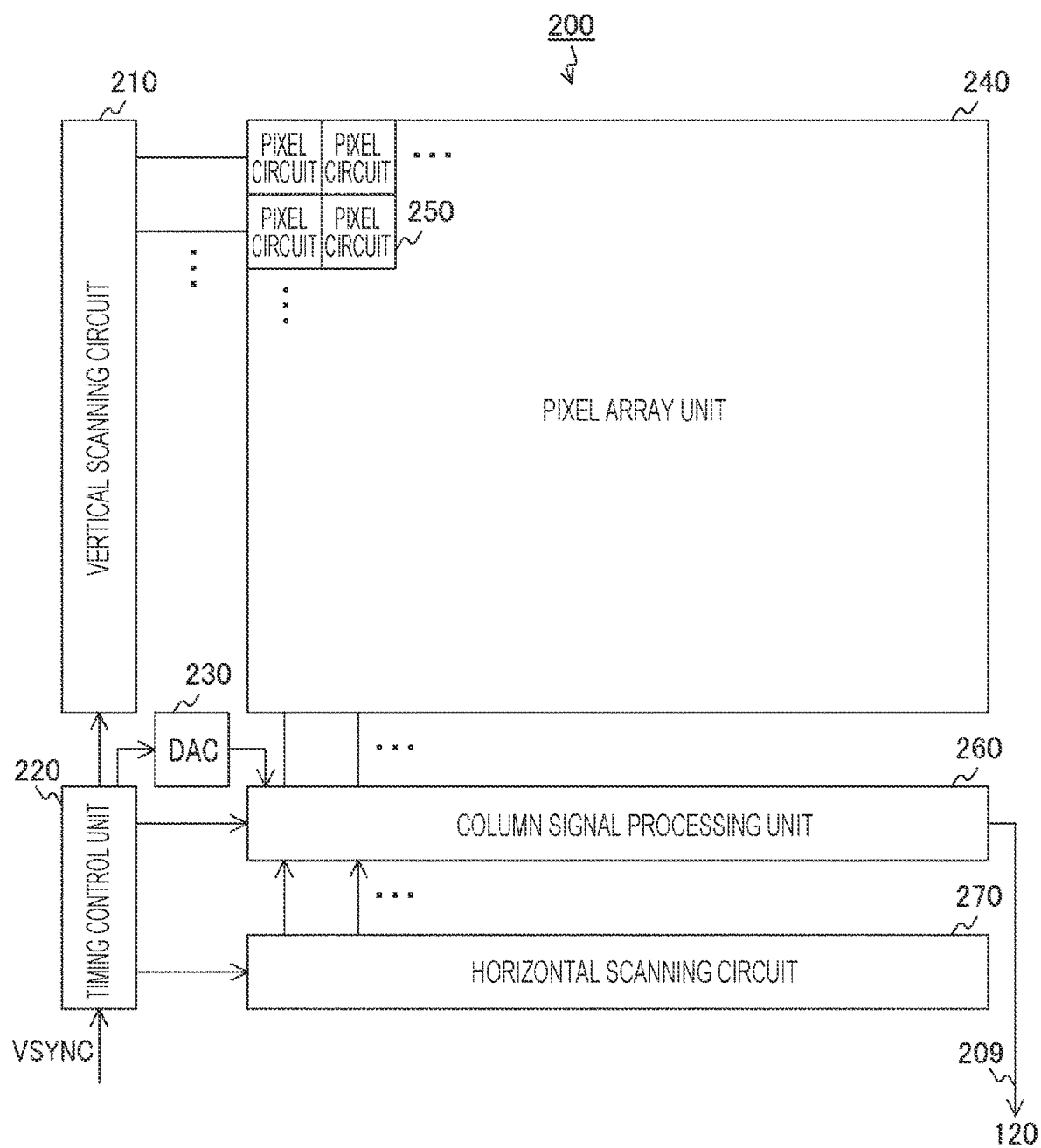
FIG. 2A and FIG. 2B are block diagrams illustrating a configuration example of a solid-state image sensor according to the first embodiment of the present technology.
Figure 2B:
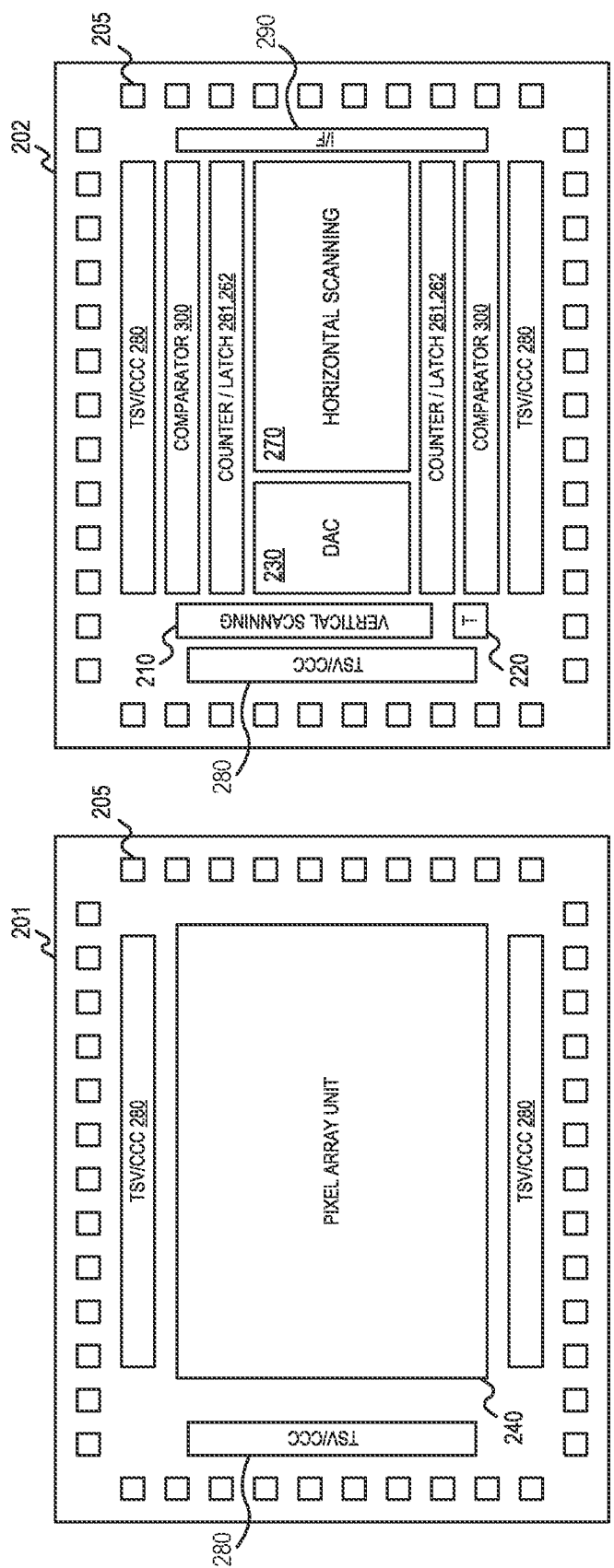

FIG. 2A and FIG. 2B are block diagrams illustrating a configuration example of the solid-state image sensor 200 according to the first embodiment of the present technology. The solid-state image sensor 200 includes a vertical scanning circuit 210, a timing control unit 220, a digital to analog converter (DAC) 230, a pixel array unit 240, a column signal processing unit 260, and a horizontal scanning circuit 270. The solid-state image sensor 200 may be integrated into a single chip, or may be implemented as a stacked structure. In the stacked structure, the various illustrated components may be respectively formed in multiple substrates which are then stacked together, bonded or laminated, and connected to one another by a connection portion.

In the example illustrated in FIG. 2B, a first substrate 201 includes the pixel array unit 240 and a second substrate 202 includes the vertical scanning circuit 210; the timing control unit 220; the DAC 230; a pair of counter areas 261, a pair of latch areas 262, and a pair of comparator areas 300 (which may be components of the column signal processing unit 260); the horizontal scanning circuit 270; and an interface (I/F) 290. In this example, the first substrate 201 and the second substrate 202 both include a plurality of pads 205 and a plurality of connection portions 280. The connection portions 280 may be Cu-Cu connection (CCC), a through-silicon via (TSV), a continuous wire, and the like. As illustrated in FIG. 2B, the comparator 300 is disposed adjacent the connection portions 280.

In another example, the pixel array unit 240 and a control circuit including the vertical scanning circuit 210 and the timing control unit 220 may be disposed in a first substrate; and a signal processing circuit including the DAC 230, the column signal processing unit 260, and the horizontal scanning circuit 270 may be disposed in a second substrate. In another example, the pixel array unit 240 may be disposed in a first substrate; the control circuit including the vertical scanning circuit 210 and the timing control unit 220 may be disposed in a second substrate; and the signal processing circuit including the DAC 230, the column signal processing unit 260, and the horizontal scanning circuit 270 may be disposed in a third substrate.

In the pixel array unit 240, a plurality of pixel circuits 250 is arrayed in a two-dimensional lattice pattern. Hereinafter, a set of the pixel circuits 250 arrayed in a predetermined horizontal direction is referred to as a "row", and a set of the pixel circuits 250 arrayed in a vertical direction with respect to the row is referred to as a "column".

The vertical scanning circuit 210 sequentially drives the rows to cause the pixel circuits 250 to output signals.

The timing control unit 220 controls operation timing of each of the vertical scanning circuit 210, the DAC 230, the column signal processing unit 260, and the horizontal scanning circuit 270 in synchronization with a vertical synchronization signal VSYNC. The vertical synchronization signal VSYNC is a periodic signal having a predetermined frequency (such as 60 hertz) indicating imaging timing.

The DAC 230 generates a predetermined reference signal by digital to analog (DA) conversion. As the reference signal, for example, a sawtooth ramp signal is used. The DAC 230 supplies the reference signal to the column signal processing unit 260. Note that the DAC 230 is an example of a reference signal supply unit described in the claims.

The pixel circuit 250 generates an analog pixel signal by photoelectric conversion and supplies the analog pixel signal to the column signal processing unit 260.

The column signal processing unit 260 performs signal processing such as AD conversion processing and correlated double sampling (CDS) processing for the pixel signal for each column. The column signal processing unit 260 supplies image data including a processed digital signal to the DSP circuit 120 via the signal line 209.

The horizontal scanning circuit 270 controls the column signal processing unit 260 to sequentially output the digital signals.

Configuration Example of Pixel Circuit

Figure 3:
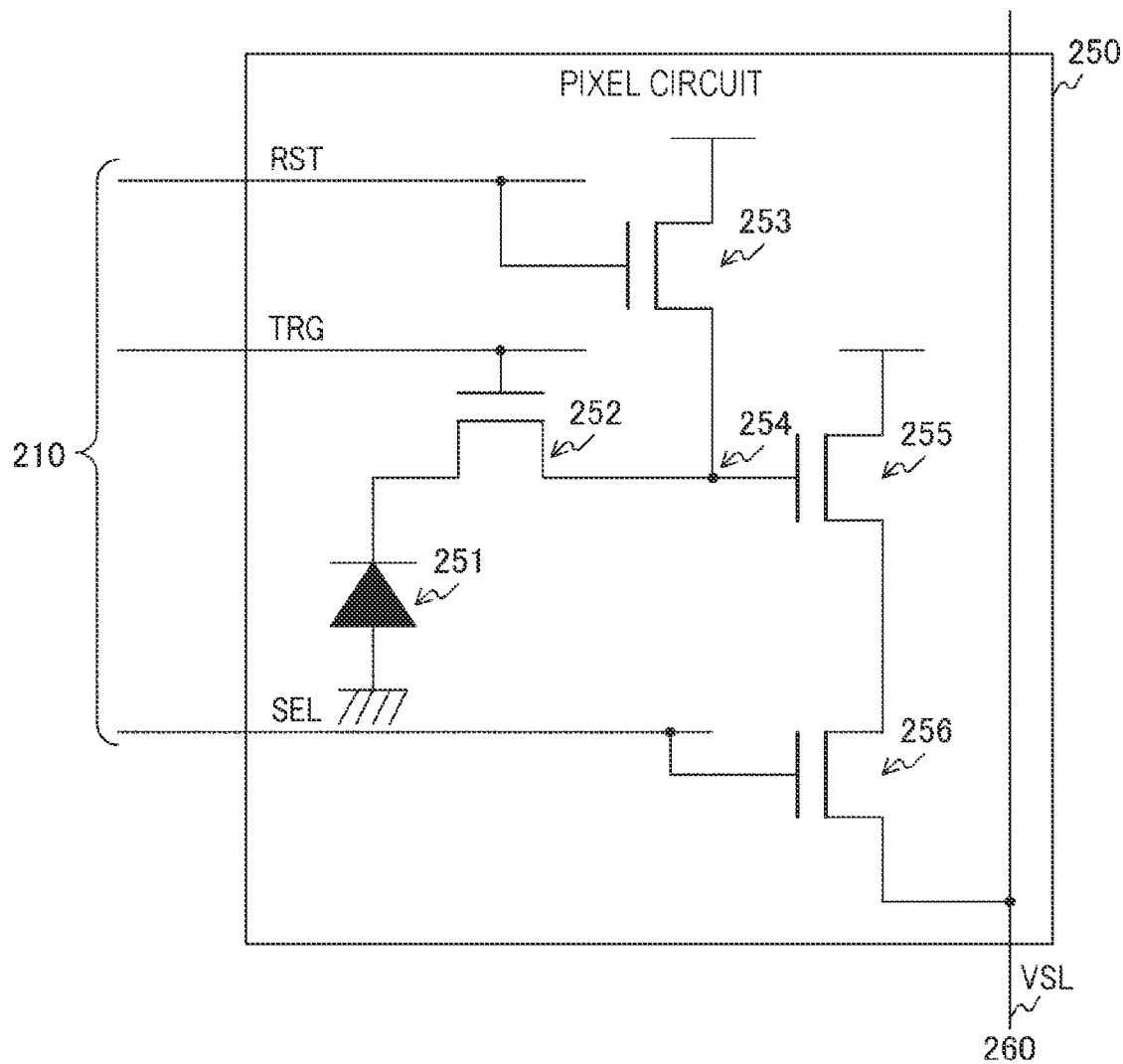
FIG. 3 is a circuit diagram illustrating a configuration example of a pixel circuit according to the first embodiment of the present technology.

FIG. 3 is a circuit diagram illustrating a configuration example of the pixel circuit 250 according to the first embodiment of the present technology. The pixel circuit 250 includes a photoelectric conversion element 251, a transfer transistor 252, a reset transistor 253, a floating diffusion layer 254, an amplification transistor 255, and a selection transistor 256. Furthermore, in the pixel array unit 240, the vertical signal line VSL is wired for each column along the vertical direction.

The photoelectric conversion element 251 photoelectrically converts incident light to generate charges. The transfer transistor 252 transfers the charges from the photoelectric conversion element 251 to the floating diffusion layer 254 according to a drive signal TRG from the vertical scanning circuit 210.

The reset transistor 253 extracts and initializes the charges from the floating diffusion layer 254 according to a drive signal RST from the vertical scanning circuit 210.

The floating diffusion layer 254 accumulates the charges and generates a voltage corresponding to a charge amount. The amplification transistor 255 amplifies the voltage of the floating diffusion layer 254.

The selection transistor 256 outputs an amplified voltage signal as a pixel signal to the column signal processing unit 260 via the vertical signal line VSL according to a drive signal SEL from the vertical scanning circuit 210.

Note that the pixel circuit 250 is not limited to the circuit illustrated in FIG. 3 as long as the pixel circuit 250 can generate the pixel signal by photoelectric conversion.

Configuration Example of Column Signal Processing Unit

Figure 4:
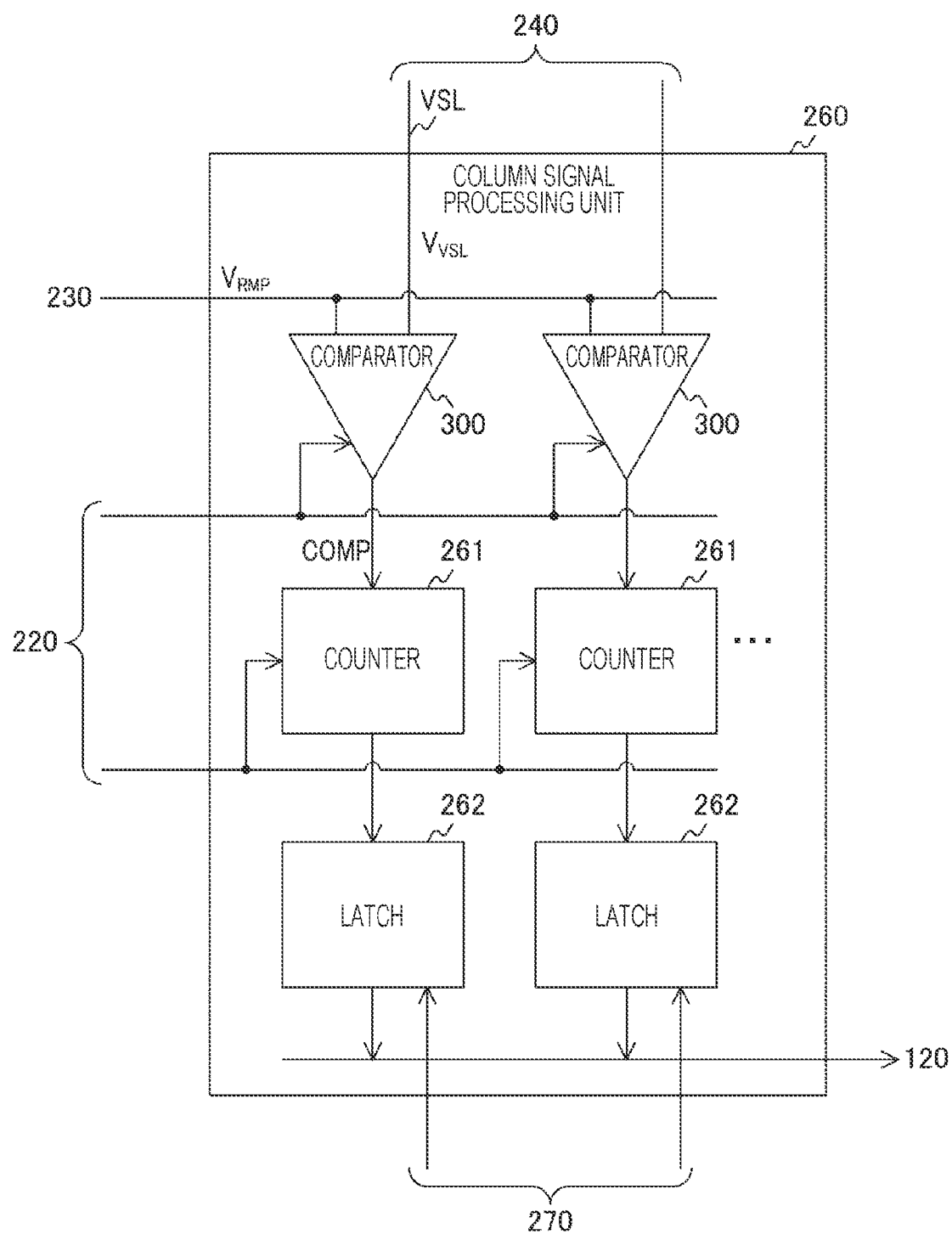
FIG. 4 is a block diagram illustrating a configuration example of a column signal processing unit according to the first embodiment of the present technology.

FIG. 4 is a block diagram illustrating a configuration example of the column signal processing unit 260 according to the first embodiment of the present technology. In the column signal processing unit 260, a comparator 300, a counter 261, and a latch 262 are arranged for each column. In a case where the number of columns is N (N is an integer), N comparators 300, N counters 261, and N latches 262 are arranged.

The comparator 300 compares the reference signal from the DAC 230 with the pixel signal from a corresponding column. Hereinafter, the voltage of the reference signal is referred to as a reference voltage $V_{RMP}$, and the voltage of the pixel signal input via the vertical signal line VSL is referred to as an input voltage $V_{VSL}$. The comparator 300 supplies a comparison result COMP between the reference voltage $V_{RMP}$ and the input voltage $V_{VSL}$ to the counter 261 of the corresponding column.

Furthermore, the input voltage $V_{VSL}$ of when the pixel circuit 250 is initialized is hereinafter referred to as a "reset level", and the input voltage $V_{VSL}$ of when the charge is transferred to the floating diffusion layer 254 is hereinafter referred to as a "signal level".

The counter 261 counts a count value over a period until the comparison result COMP is inverted. For example, the counter 261 down-counts over a period until the comparison result COMP with the reset level is inverted, and up-counts over a period until the comparison result COMP with the signal level is inverted. By the counting, the CDS processing for obtaining a difference between the reset level and the signal level is implemented.

Then, the counter 261 causes the latch 262 to hold a digital signal indicating the count value. The AD conversion processing for converting the analog pixel signal into the digital signal is implemented by the comparator 300 and the counter 261. That is, the comparator 300 and the counter 261 function as an ADC. An ADC using a comparator and a counter in this manner is generally called single slope ADC.

Note that the CDS processing is implemented by up-counting and down-counting. However, the CDS processing is not limited to this configuration. A configuration in which the counter 261 performs only the up-counting or the down-counting, and CDS processing for obtaining a difference is executed by a subsequent-stage circuit may be adopted.

The latch 262 holds the digital signal. The latch 262 outputs the held digital signal to the DSP circuit 120 under the control of the horizontal scanning circuit 270.

Configuration Example of Comparator

Figure 5:
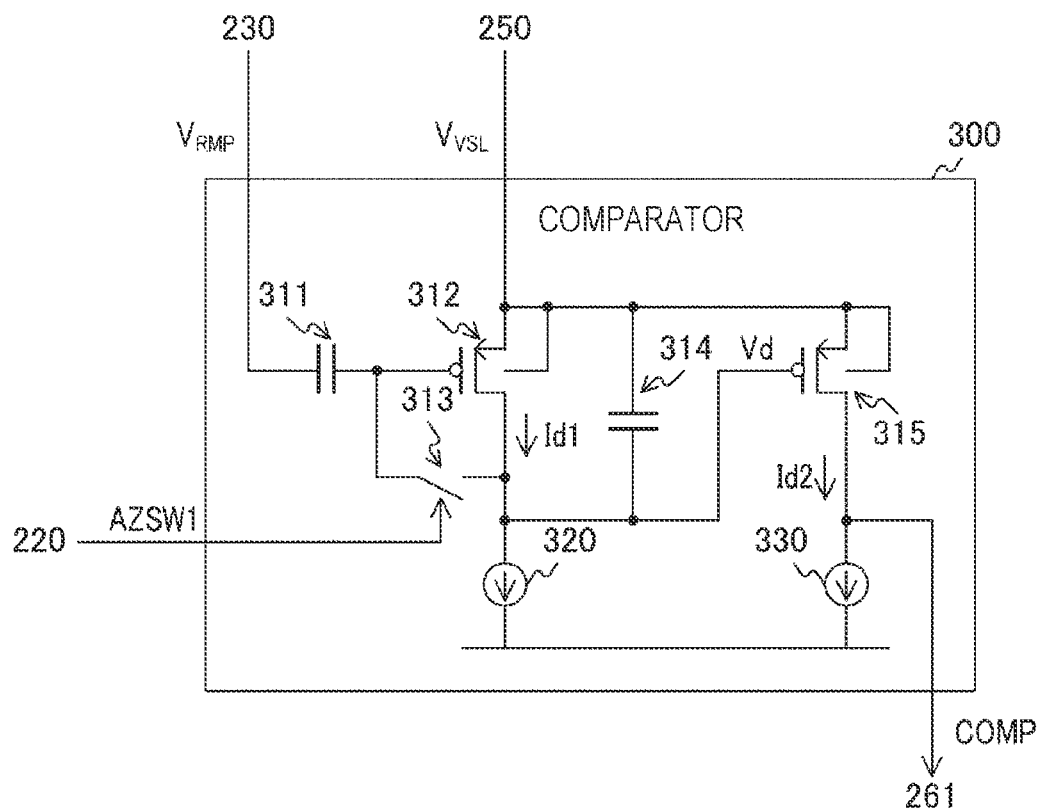
FIG. 5 is a circuit diagram illustrating a configuration example of a comparator according to the first embodiment of the present technology.

FIG. 5 is a circuit diagram illustrating a configuration example of the comparator 300 according to the first embodiment of the present technology. The comparator 300 includes capacitors 311 and 314, an input transistor 312, an auto-zero switch 313, an output transistor 315, an input-side current source 320, and an output-side current source 330.

The capacitor 311 is inserted between the DAC 230 and a gate of the input transistor 312.

A source of the input transistor 312 is connected to the vertical signal line VSL, and the input voltage $V_{VSL}$ is input to the source. Furthermore, the reference voltage $V_{RMP}$ is input to the gate of the input transistor 312 via the capacitor 311. At a point of time when the input voltage $V_{VSL}$ input to the source substantially coincides with the reference voltage $V_{RMP}$ input to the gate, the input transistor 312 becomes a voltage state that is the same as a voltage state at an auto-zero time and outputs a drain voltage Vd according to the input voltage $V_{VSL}$ and the reference voltage $V_{RMP}$ from a drain. Here, "substantially coincide" means that changes from voltage values in respective auto-zero periods are completely coincident or the difference falls within a predetermined allowable value. For example, a pMOS transistor is used as the input transistor 312.

Furthermore, a back gate and the source of the input transistor 312 are desirably short-circuited in order to suppress a back gate effect.

The auto-zero switch 313 is for short-circuiting the gate and the drain of the input transistor 312 according to a control signal AZSW1 from the timing control unit 220.

The input-side current source 320 is inserted between the drain of the input transistor 312 and a predetermined reference terminal (such as a ground terminal). The input-side current source 320 supplies a fixed current Id1. The input-side current source 320 is implemented by an n-channel MOS (nMOS) transistor and the like. The circuit configuration of the input-side current source 320 will be described below.

The capacitor 314 is inserted between the source and the drain of the input transistor 312.

A source of the output transistor 315 is connected to the vertical signal line VSL, and the input voltage $V_{VSL}$ is input to the source. Furthermore, a gate of the output transistor 315 is connected to the drain of the input transistor 312, and the drain voltage Vd is input to the gate of the output transistor 315. For example, as the output transistor 315, a pMOS transistor is used. Furthermore, a back gate and the source of the output transistor 315 are desirably short-circuited.

The output transistor 315 outputs a signal indicating whether or not a difference between the input voltage $V_{VSL}$ input to the source and the drain voltage Vd input to the gate exceeds a predetermined threshold voltage from a drain as a comparison result COMP. The comparison result COMP is supplied to the counter 261.

The output-side current source 330 is inserted between the drain of the output transistor 315 and a predetermined reference terminal (such as a ground terminal) and supplies a fixed current Id2. The output-side current source 330 is implemented by an nMOS transistor and the like. The circuit configuration of the output-side current source 330 will be described below.

Figure 6:
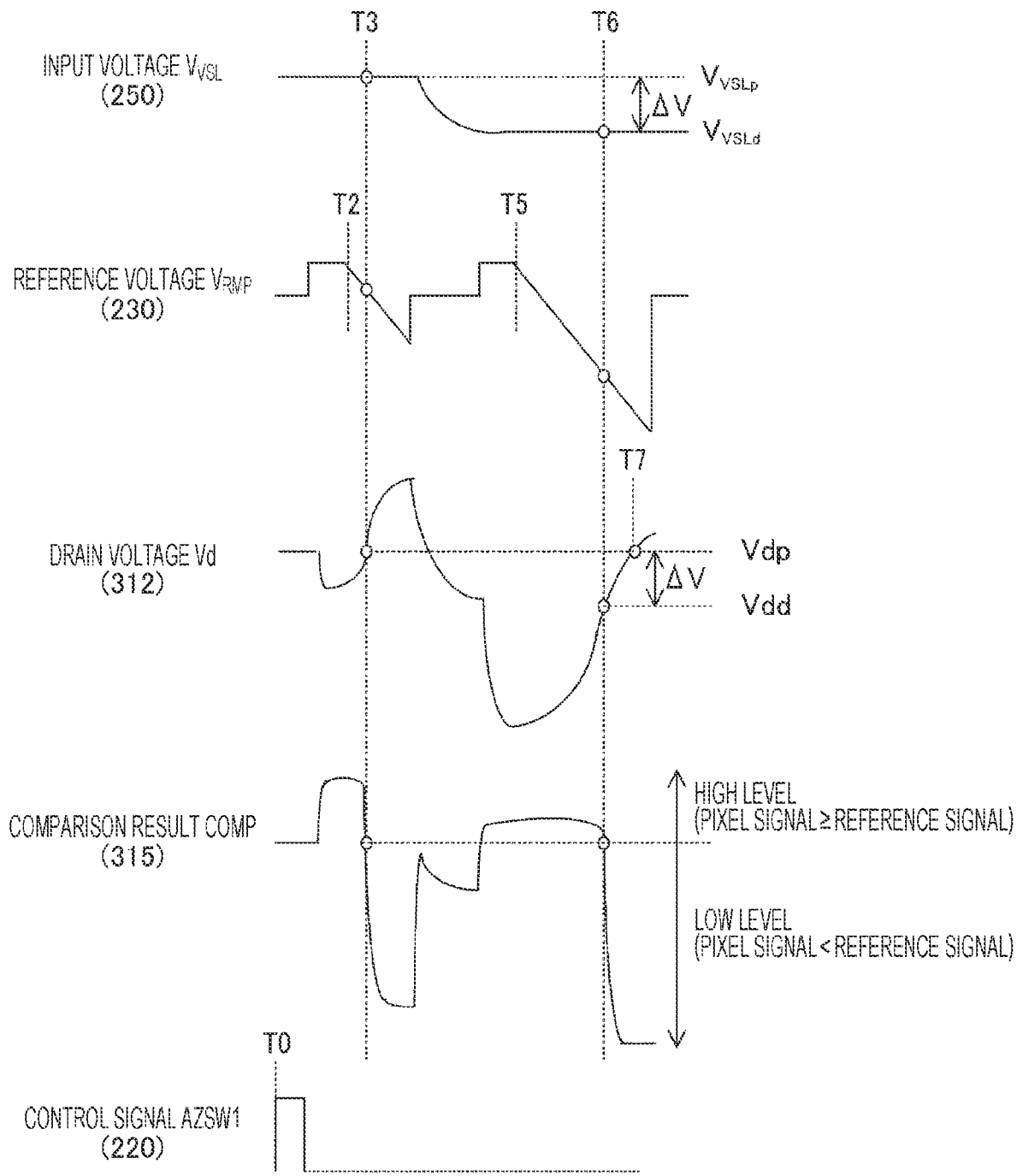
FIG. 6 is a timing chart illustrating an example of variation in input and output signals of the comparator according to the first embodiment of the present technology.

FIG. 6 is a timing chart illustrating an example of variation in input and output signals of the comparator 300 according to the first embodiment of the present technology.

At timing T0 immediately before the start of AD conversion, the control signal AZSW1 is input over a predetermined auto-zero period. As a result, the gate and the drain of the input transistor 312 are short-circuited, and auto-zeroing of the comparator 300 is performed.

Next, the DAC 230 gradually lowers the reference voltage $V_{RMP}$ over a fixed period from timing T2. Meanwhile, the pixel circuit 250 is initialized, and the input voltage $V_{VSL}$ (that is, the reset level) at this time is set to $V_{VSLp}$.

Then, at timing T3, the reference voltage $V_{RMP}$ is assumed to substantially coincide with the reset level $V_{VSLp}$.

The drain voltage Vd of the input transistor 312 at this timing T3 is set to Vdp. When a level lower than Vdp is set to a low level and a level equal to or higher than Vdp is set to a high level, the drain voltage Vd of the input transistor 312 is inverted from the low level to the high level at the timing T3.

Next, the DAC 230 initializes the reference voltage and gradually lowers the reference voltage $V_{RMP}$ over a fixed period from timing T5. Meanwhile, charges are transferred to the floating diffusion layer 254, and the input voltage $V_{VSL}$ (that is, the signal level) at this time is set to $V_{VSLd}$. This signal level $V_{VSLd}$ is assumed to be lower than the reset level $V_{VSLp}$ by $\Delta V$.

Then, at timing T6, the reference voltage $V_{RMP}$ is assumed to substantially coincide with the signal level $V_{VSLd}$. The drain voltage Vd of the input transistor 312 at this timing T6 is set to Vdd. The drain voltage Vdd is a value lower than the drain voltage Vdp by $\Delta V$. That is, the drain voltage Vdd at the timing T6 becomes lower as the input voltage (signal level $V_{VSLd}$) at that time is lower.

Since the drain voltage Vdd of the input transistor 312 is lowered by $\Delta V$ from the drain voltage Vdp at the reset level conversion time, the timing when this drain voltage Vd is determined to be inverted is timing T7 after the timing T6 in an existing technology. Therefore, if this drain voltage Vd is used as the comparison result COMP, the inversion timing T7 of the comparison result COMP is shifted from the ideal timing T6 at which the reference voltage $V_{RMP}$ substantially coincides with the signal level $V_{VSLd}$. As a result, an linearity error and an offset occur in the ADC, and the image quality of the image data may be deteriorated due to these errors.

However, as described above, the output transistor 315 is provided at a subsequent stage of the input transistor 312, and the source and the drain of the input transistor 312 are connected to the source and the gate of the output transistor 315. With this connection, a drain-source voltage Vds of the input transistor 312 is input as a gate-source voltage of the output transistor 315.

As illustrated in FIG. 6, a voltage drop amount $\Delta V$ of the input voltage $V_{VSL}$ is the same as a voltage drop amount of the drain voltage Vd at the timings T3 and T6 when the reference voltage $V_{RMP}$ substantially coincides with the input voltage $V_{VSL}$. Therefore, at these timings, the drain-source voltages Vds have the same value. At this time (that is, at the timings T3 and T6), the value of the drain-source voltage Vds is the same as the value at the auto-zero time. Since the drain-source voltage Vds is the gate-source voltage of the output transistor 315, the drain voltage of the output transistor 315 is inverted at the timings T3 and T6.

Since the inversion timing of the comparison result COMP is the ideal timing at which the reference voltage $V_{RMP}$ substantially coincides with the signal level $V_{VSLd}$, an error in the inversion timing is suppressed. As a result, the linearity error and the offset can be made small and the image quality of the image data can be improved, as compared with a case of using the drain voltage Vd as the comparison result COMP.

Next, the reason why the voltage drop amount $\Delta V$ of the drain voltage Vd of the input transistor 312 becomes the same as the voltage drop amount of the input voltage $V_{VSL}$ input to the source at the timings T3 and T6 will be described.

Figure 7:
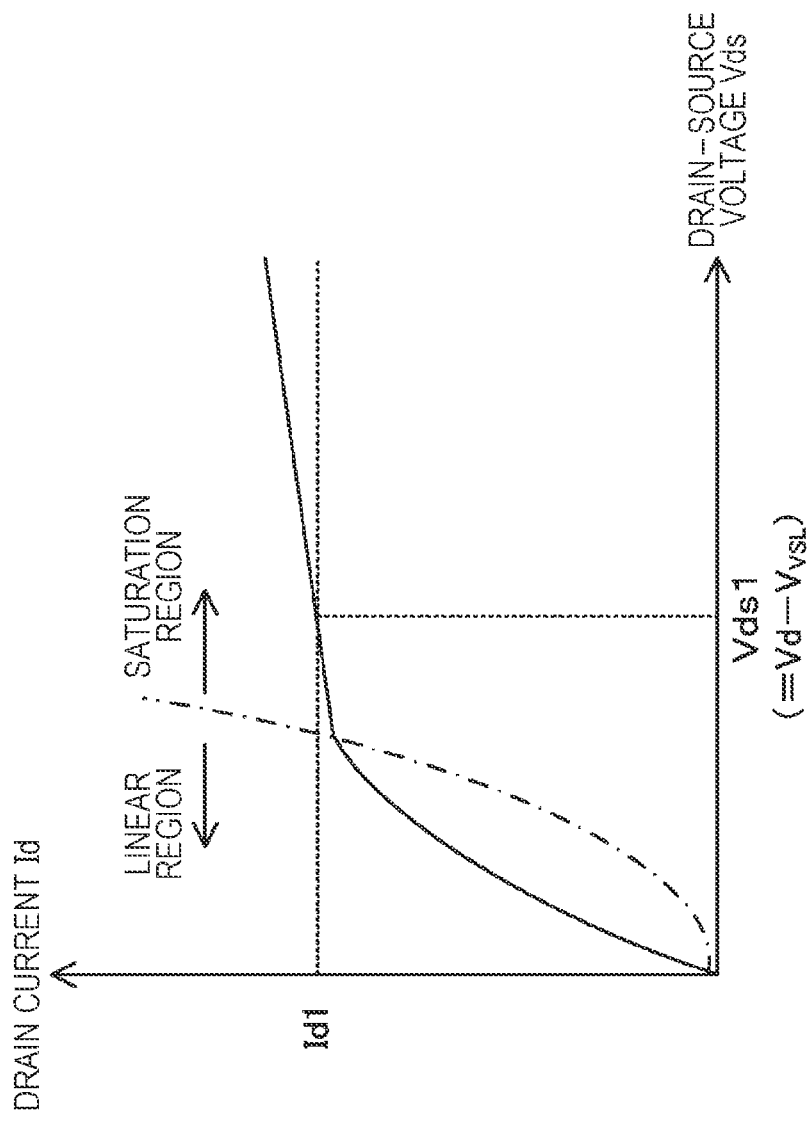
FIG. 7 is a graph illustrating an example of a characteristic of a pMOS transistor according to the first embodiment of the present technology.

FIG. 7 is a graph illustrating an example of a characteristic of a pMOS transistor according to the first embodiment of the present technology. In FIG. 7, the vertical axis represents a drain current, and the horizontal axis represents the drain-source voltage. Furthermore, the one-dot chain line illustrates a boundary between a linear region and a saturation region.

As a general rule, an operating point of the pMOS transistor is determined so as to operate in the saturation region at the auto-zero time. A drain current Id in this saturation region is expressed by the following expression.

$$Id = (1/2) \cdot \mu C_{OX}(W/L) \cdot (V_{GS} - V_{th})^2 (1 + \lambda V_{ds}) \qquad \text{Expression 1}$$

In the above expression, μ represents electron mobility and the unit is, for example, square meter per volt second ($m^2/V·s$). $C_{OX}$ represents a capacitance per unit area of a MOS capacitor and the unit is, for example, farad per meter (F/m). W represents a gate width and the unit is, for example, meter (m). L represents a gate length and the unit is, for example, meter (m). Vth represents the threshold voltage and the unit is, for example, volt (V). λ represents a predetermined coefficient. Furthermore, the unit of the drain-source voltage Vds is, for example, volt (V), and the unit of the drain current Id is, for example, ampere (A).

Since the input transistor 312 is a pMOS transistor, the expression 1 is established in the saturation region. At this time, the drain current Id is a fixed value (that is, Id1) supplied from the input-side current source 320. Furthermore, the electron mobility μ, the unit capacity $C_{OX}$, the gate width W, the gate length L, the threshold voltage Vth, and the coefficient λ are fixed values.

Furthermore, when the reference voltage $V_{RMP}$ and the input voltage $V_{VSL}$ input to the gate and the source of the input transistor 312 substantially coincide with each other, the gate-source voltage $V_{GS}$ is a fixed value determined at the auto-zero time.

Therefore, when the reference voltage $V_{RMP}$ and the input voltage $V_{VSL}$ input to the gate and the source of the input transistor 312 substantially coincide with each other, the drain-source voltage Vds is also a fixed value according to the expression 1. When the fixed drain-source voltage is Vds1, the following expressions are established at the above-described timings T3 and T6.

$$Vds1 = V_{VSLp} - Vdp \qquad \text{Expression 2}$$

$$Vds1 = V_{VSLd} - Vdd \qquad \text{Expression 3}$$

When the drain-source voltage Vds1 is deleted from the expressions 2 and 3, the following expression is obtained.

$$V_{VSLp} - V_{VSLd} = Vdp - Vdd \qquad \text{Expression 4}$$

Note that, in a case where the operating point of the pMOS transistor is determined so as to operate in the linear region at the auto-zero time, the expression 1 takes a different form but the expression 4 is similarly established.

According to the expression 4, the voltage drop amount ΔV of the drain voltage Vd of the input transistor 312 becomes the same as the voltage drop amount of the input voltage $V_{VSL}$ input to the source. Therefore, the timing chart illustrated in FIG. 6 is obtained.

Next, a first comparative example of not providing the output transistor 315 will be considered.

Figure 8:
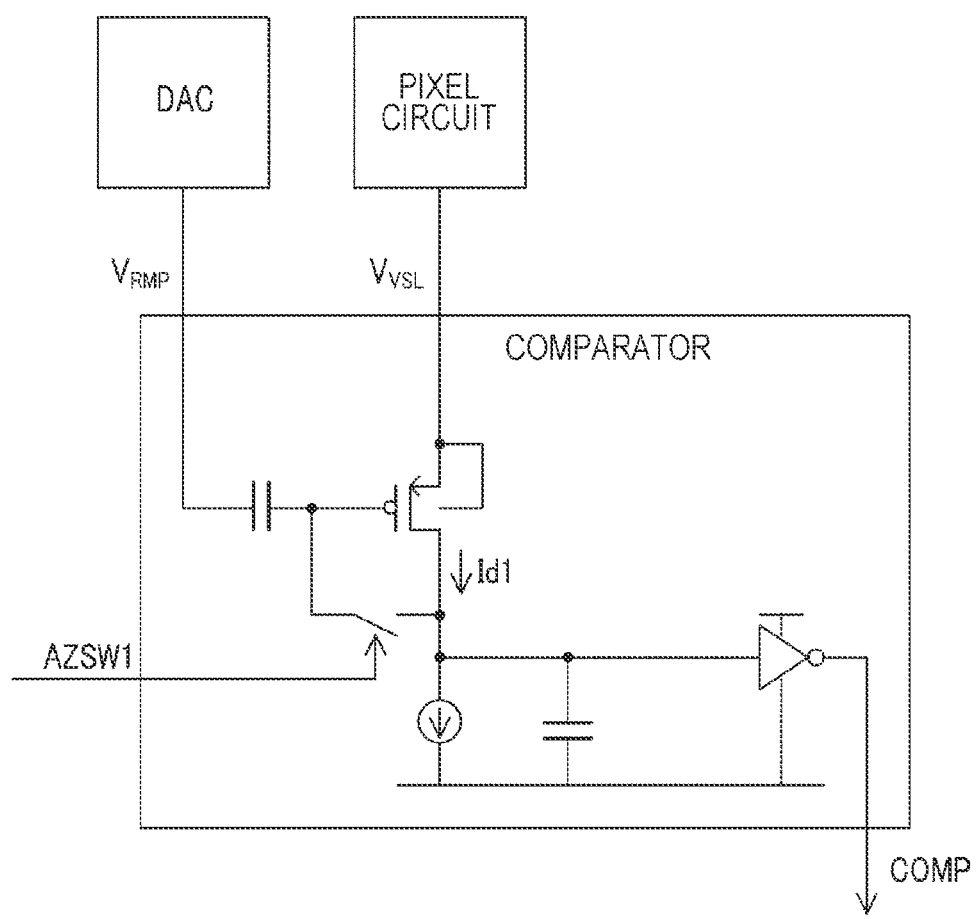
FIG. 8 is a circuit diagram illustrating a configuration example of a comparator according to a first comparative example.

FIG. 8 is a circuit diagram illustrating a configuration example of a comparator according to the first comparative example. In the first comparative example, an inverter is provided at a subsequent stage of an input transistor, instead of the output transistor 315. The inverter inverts the drain voltage of the input transistor and outputs the drain voltage as the comparison result COMP. Substantially, the drain voltage of the input transistor is used as the comparison result COMP.

Figure 9:
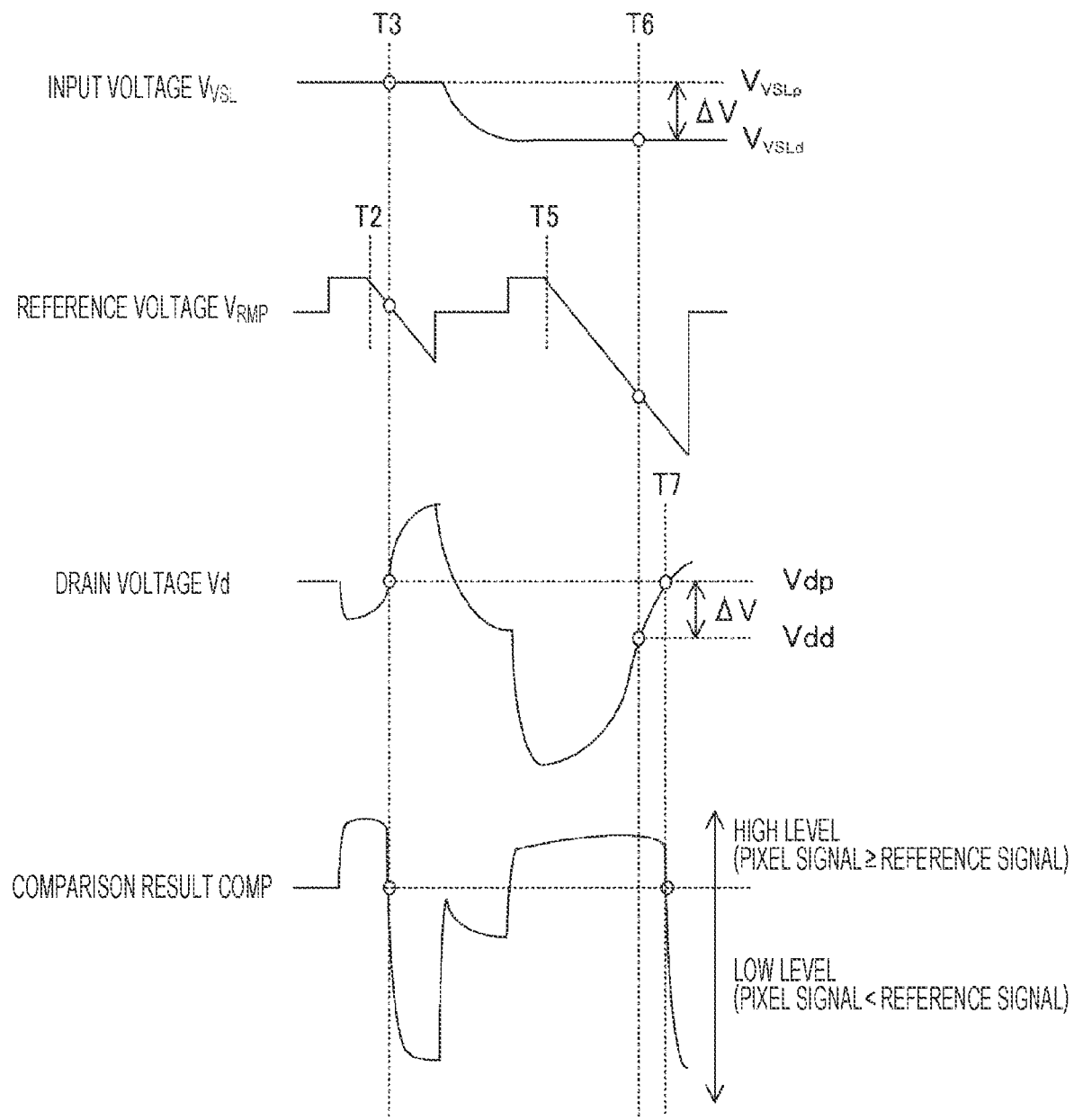
FIG. 9 is a timing chart illustrating an example of variation in input and output signals of the comparator according to the first comparative example.

FIG. 9 is a timing chart illustrating an example of variation in input and output signals of the comparator according to the first comparative example. Variation in the input voltage $V_{VSL}$, the reference voltage $V_{RMP}$, and the drain voltage Vd in the first comparative example are similar to those in the first embodiment illustrated in FIG. 6.

As described above, according to the expression 4, the voltage drop amount of the drain voltage Vd of the input transistor becomes the same as the voltage drop amount of the input voltage $V_{VSL}$ input to a source of the input transistor. For this reason, the timing T7 at which the drain voltage Vd is inverted is shifted from the ideal timing T6 at which the reference voltage substantially coincides with the signal level. Since the inverter of the first comparative example inverts the drain voltage Vd as it is, the inversion timing of the comparison result COMP is similarly shifted from the ideal timing T6. Due to this timing error, the image quality of the image data is degraded.

Next, a second comparative example using a differential amplifier circuit will be considered.

Figure 10:
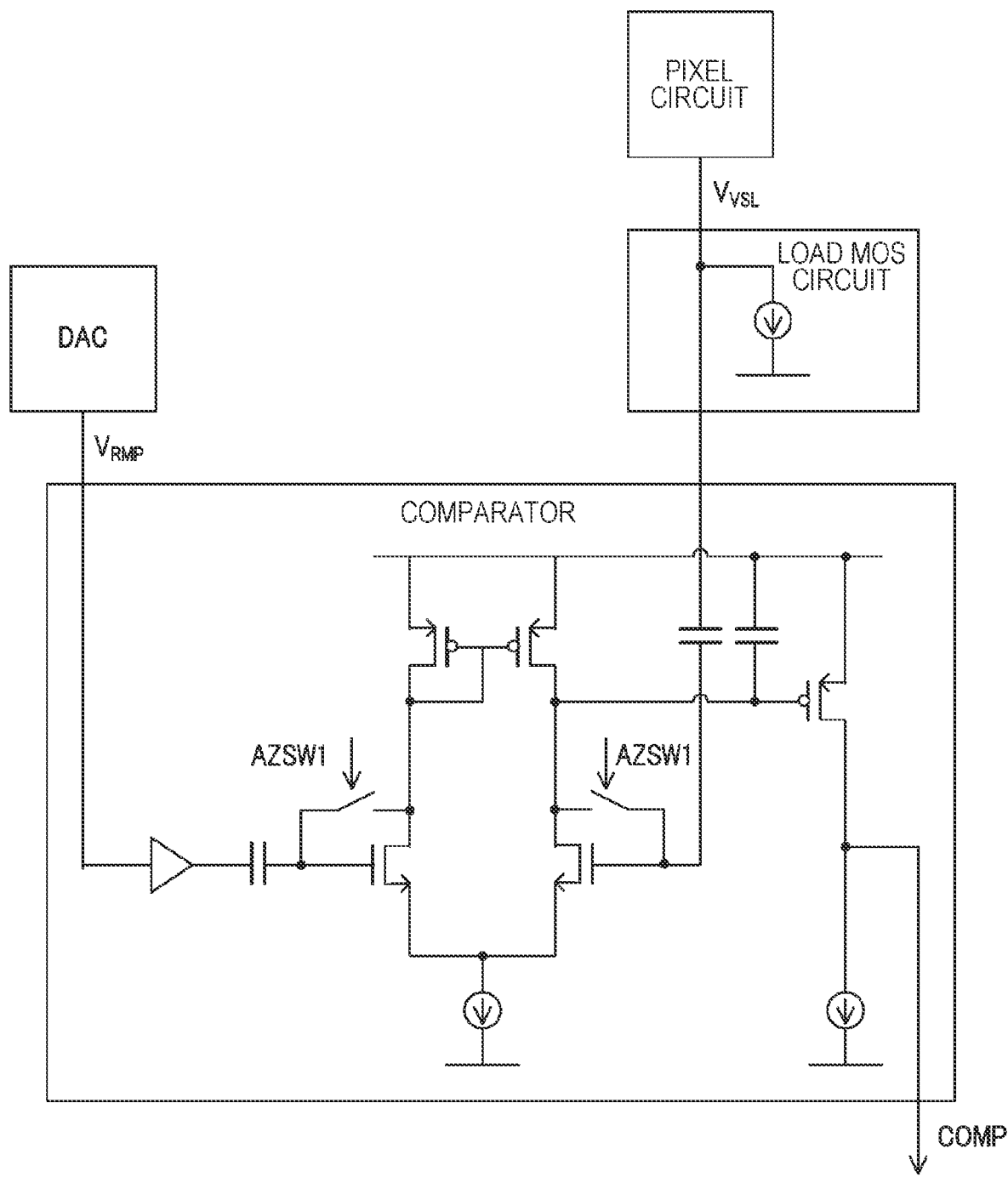
FIG. 10 is a circuit diagram illustrating a configuration example of a comparator according to a second comparative example.

FIG. 10 is a circuit diagram illustrating a configuration example of a comparator according to the second comparative example. A differential amplifier circuit is arranged in the second comparative example. Furthermore, in a load MOS circuit, a current source is further connected to the vertical signal line VSL.

Since a differential amplifier circuit is used in the second comparative example, the comparison result COMP is inverted at ideal timing at which the reference voltage substantially coincides with the signal level, unlike the first comparative example. Meanwhile, as illustrated in FIG. 10, a current source is necessary in a load MOS circuit and a power supply is necessary in the comparator. Therefore, the power consumption becomes large.

In summary, since the output transistor 315 is not provided in the first comparative example, the image quality of the image data is degraded as compared with the first embodiment. The differential amplification-type second comparative example can solve the problem of the image quality degradation of the image data, but the second comparative example is not favorable due to larger power consumption than the first embodiment.

Operation Example of Solid-state Image Sensor

Figure 11:
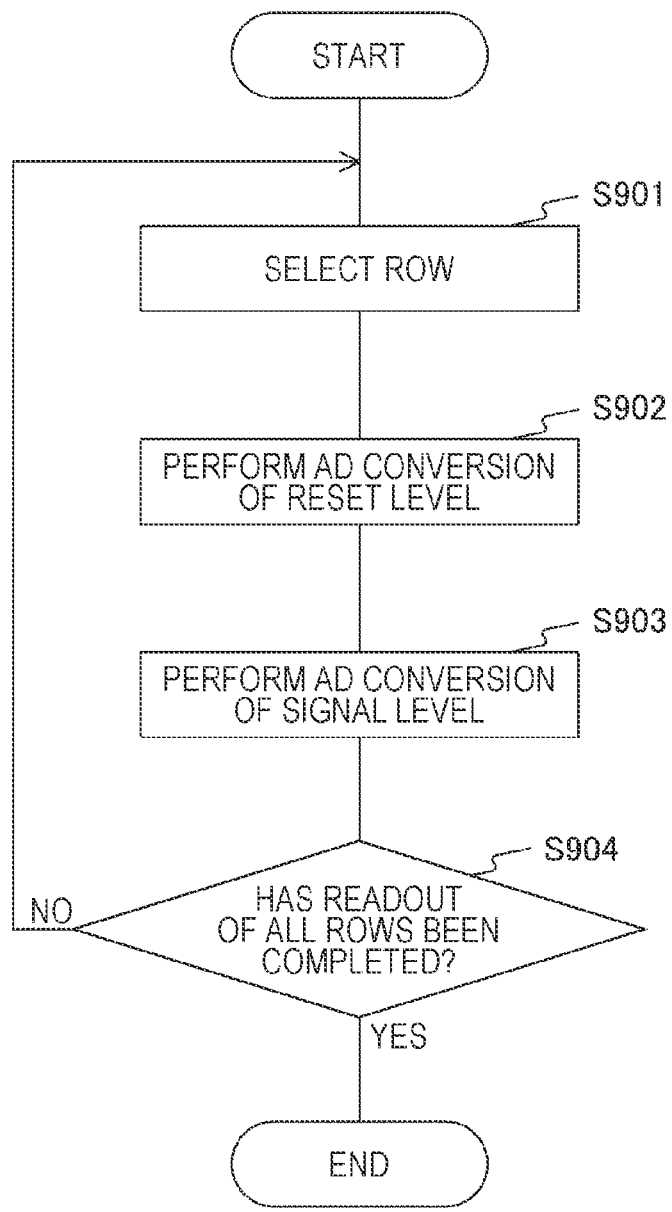
FIG. 11 is a flowchart illustrating an example of an operation of a solid-state image sensor according to the first embodiment of the present technology.

FIG. 11 is a flowchart illustrating an example of an operation of the solid-state image sensor according to the first embodiment of the present technology. This operation is started when, for example, a predetermined application for capturing image data is executed.

In the solid-state image sensor 200, the vertical scanning circuit 210 sequentially selects and drives the rows (step S901). The column signal processing unit 260 performs AD conversion for the reset level for each column (step S902) and performs AD conversion for the signal level (step S903).

The solid-state image sensor 200 determines whether or not readout of all the rows has been completed (step S904). In a case where the readout of all the rows has not been completed (step S904: No), the solid-state image sensor 200 repeatedly executes the processing of step S901 and the subsequent steps. On the other hand, in a case where readout of all the rows has been completed (step S904: Yes), the solid-state image sensor 200 terminates the operation for imaging the image data. In a case where a plurality of image data is sequentially imaged, steps S901 to S904 are repeatedly executed in synchronization with the vertical synchronization signal VSYNC.

As described above, according to the first embodiment of the present technology, the input transistor 312 supplies the drain-source voltage between the gate and the source of the output transistor 315, thereby inverting the comparison result at the timing when the input voltage coincides with the reference voltage. As a result, the noise caused by the error of the inversion timing can be reduced and the image quality of the image data can be improved.

[Modification]

In the above-described first embodiment, the input-side current source 320 has been connected to the drain of the input transistor 312. However, in this configuration, the input voltage $V_{VSL}$ is significantly decreased, the drain voltage Vd is lowered, and the state of the transistor constituting the input-side current source 320 becomes a non-conducting state, and the supply of the drain current Id1 may be stopped. A comparator 300 according to a modification of the first embodiment is different from the comparator 300 according to the first embodiment in preventing the stop of the supply of the current Id1 by adding an input-side clamp transistor.

Figure 12:
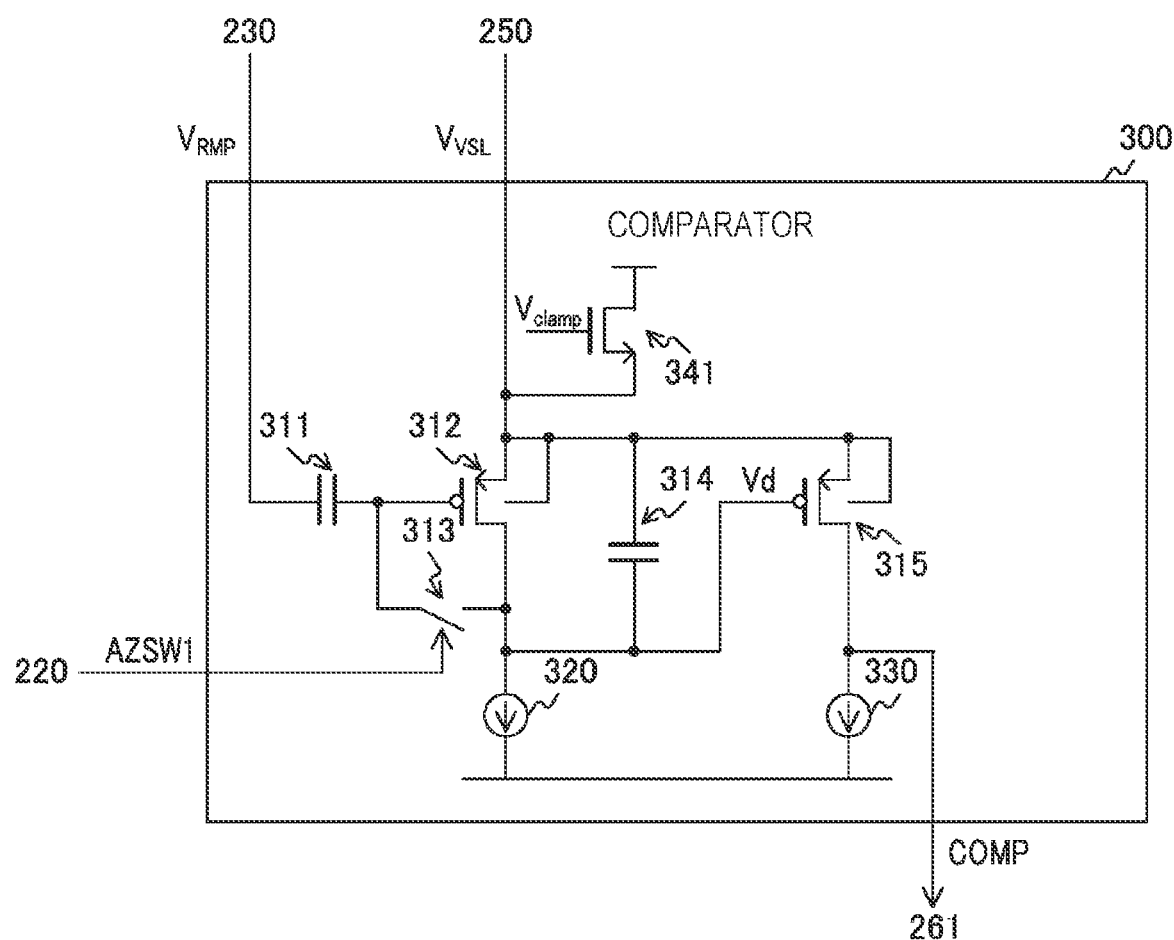
FIG. 12 is a circuit diagram illustrating a configuration example of a comparator according to a modification of the first embodiment of the present technology.

FIG. 12 is a circuit diagram illustrating a configuration example of the comparator 300 according to the modification of the first embodiment of the present technology. The comparator 300 of the modification of the first embodiment is different from the first embodiment in further including an input-side clamp transistor 341.

The input-side clamp transistor 341 is inserted between the vertical signal line VSL (that is, the source of the input transistor 312) and the power supply terminal. An nMOS transistor is used as the input-side clamp transistor 341, and a fixed bias voltage $V_{clamp}$ is applied to a gate of the input-side clamp transistor 341. The input-side clamp transistor 341 can limit the drain voltage Vd to a predetermined lower-limit voltage or larger. With the configuration, the transistor constituting the input-side current source 320 can be maintained in a conductive state, and the stop of the supply of the current Id1 can be prevented.

As described above, according to the modification of the first embodiment of the present technology, the input-side clamp transistor 341 suppresses the decrease in the drain voltage Vd, thereby preventing the stop of the supply of the current Id1.

2. Second Embodiment

In the above-described modification of the first embodiment, the input-side clamp transistor 341 has been inserted between the power supply terminal and the vertical signal line VSL to suppress the decrease in the drain voltage Vd. However, in this configuration, when the current flows through the input-side clamp transistor 341, the current to flow through the vertical signal line VSL decreases by the amount of the current flowing through the input-side clamp transistor 341, and there is a possibility that a settling time of the vertical signal line VSL becomes long. A comparator 300 according to a second embodiment is different from the modification of the first embodiment in that an input-side clamp transistor is inserted between a source and a drain of an input transistor 312.

Figure 13:
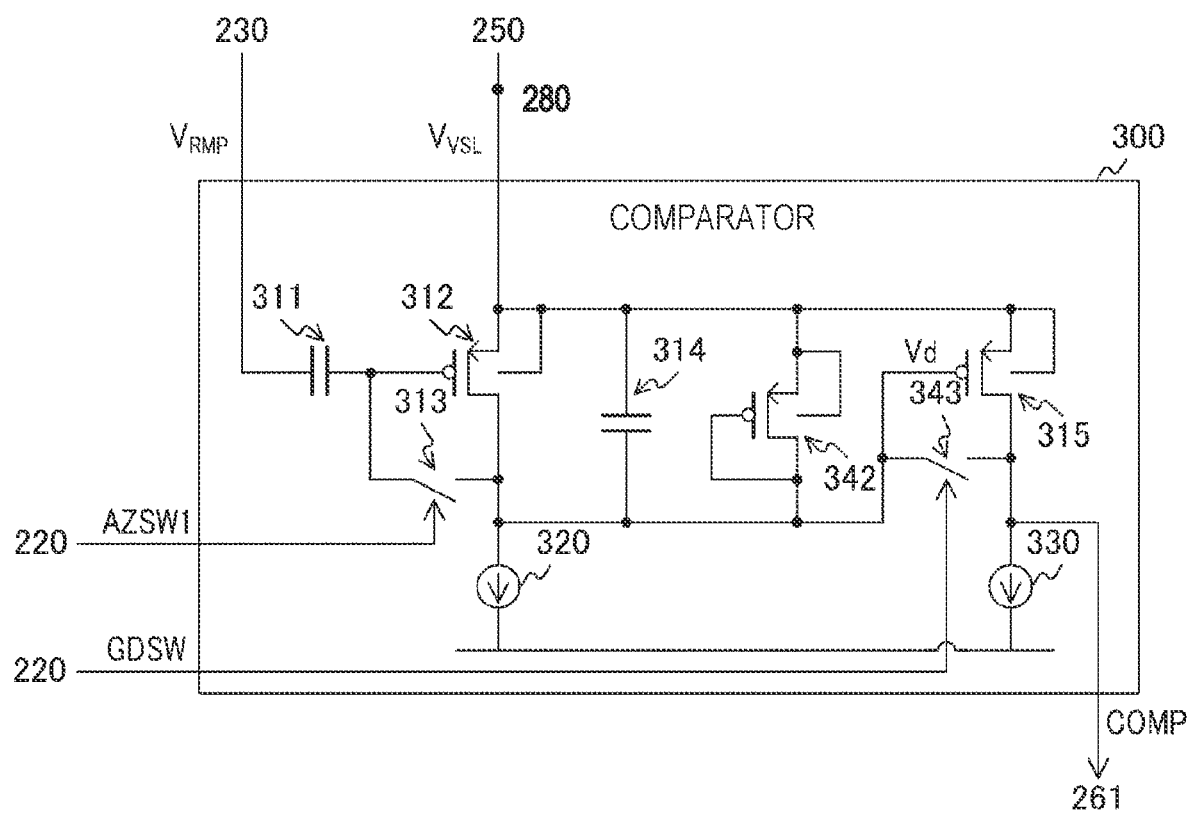
FIG. 13 is a circuit diagram illustrating a configuration example of a comparator according to the second embodiment of the present technology.

FIG. 13 is a circuit diagram illustrating a configuration example of the comparator 300 according to the second embodiment of the present technology. The comparator 300 receives a pixel signal $V_{VSL}$ from the pixel circuit 250 via a connection portion 280. The connection portion 280 may be Cu-Cu connection (CCC), a through-silicon via (TSV), a continuous wire, and the like. The comparator 300 according to the second embodiment is different from the modification of the first embodiment in including an input-side clamp transistor 342 instead of the input-side clamp transistor 341. Furthermore, an initialization switch 343 may be further included.

The input-side clamp transistor 342 is inserted between a source and a drain of an input transistor 312. A pMOS transistor is used as the input-side clamp transistor 342, and a gate of the input-side clamp transistor 342 is short-circuited with a drain of the input-side clamp transistor 342. Furthermore, a back gate and the source of the input-side clamp transistor 342 are desirably short-circuited. The input-side clamp transistor 342 can suppress a decrease in a drain voltage Vd of when the input transistor 312 is in a non-conducting state. Furthermore, since the input-side clamp transistor is not connected to a power supply terminal, a current of a vertical signal line VSL is not reduced, and a settling time can be made shorter than the modification of the first embodiment.

Furthermore, the initialization switch 343 opens and closes a path between a gate and a drain of an output transistor 315 according to a control signal GDSW from a timing control unit 220.

Figure 14:
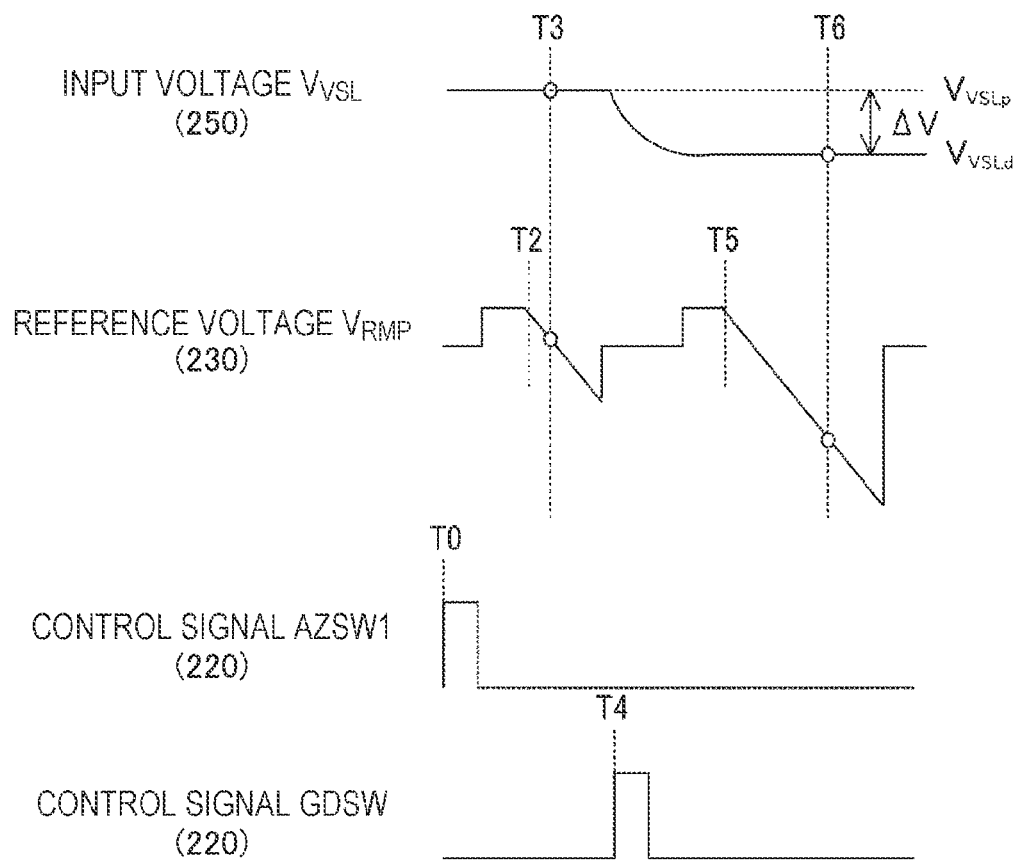
FIG. 14 is a timing chart illustrating an example of variation in input and output signals of the comparator according to the second embodiment of the present technology.

FIG. 14 is a timing chart illustrating an example of variation in input and output signals of the comparator 300 according to the second embodiment of the present technology.

The timing control unit 220 supplies the control signal GDSW to close the output transistor 315 over a pulse period from timing T4 between an AD conversion period at a reset level and an AD conversion period at a signal level. By this control, sticking of the drain voltage Vd to a lower-limit voltage can be suppressed by the vertical signal line VSL and the input-side clamp transistor 342 immediately before AD conversion of the signal level. As a result, the drain voltage Vd is stabilized, an error in the AD conversion of the signal level can be reduced, and an offset and a linearity error can be reduced.

As described above, according to the second embodiment of the present technology, the input-side clamp transistor 342 is inserted between the source and the drain of the input transistor 312, and thus a decrease in the current of the vertical signal line VSL can be suppressed.

3. Third Embodiment

In the above-described second embodiment, only the output of the output-side current source 330 has been connected to the drain of the output transistor 315. However, in this configuration, the voltage of a comparison result COMP may not be stabilized due to variation in characteristics of elements constituting a circuit. A comparator 300 according to a third embodiment is different from the second embodiment in setting a gate voltage of an output transistor 315 on the basis of an input-side current Id1 during an auto-zero period.

Figure 15:
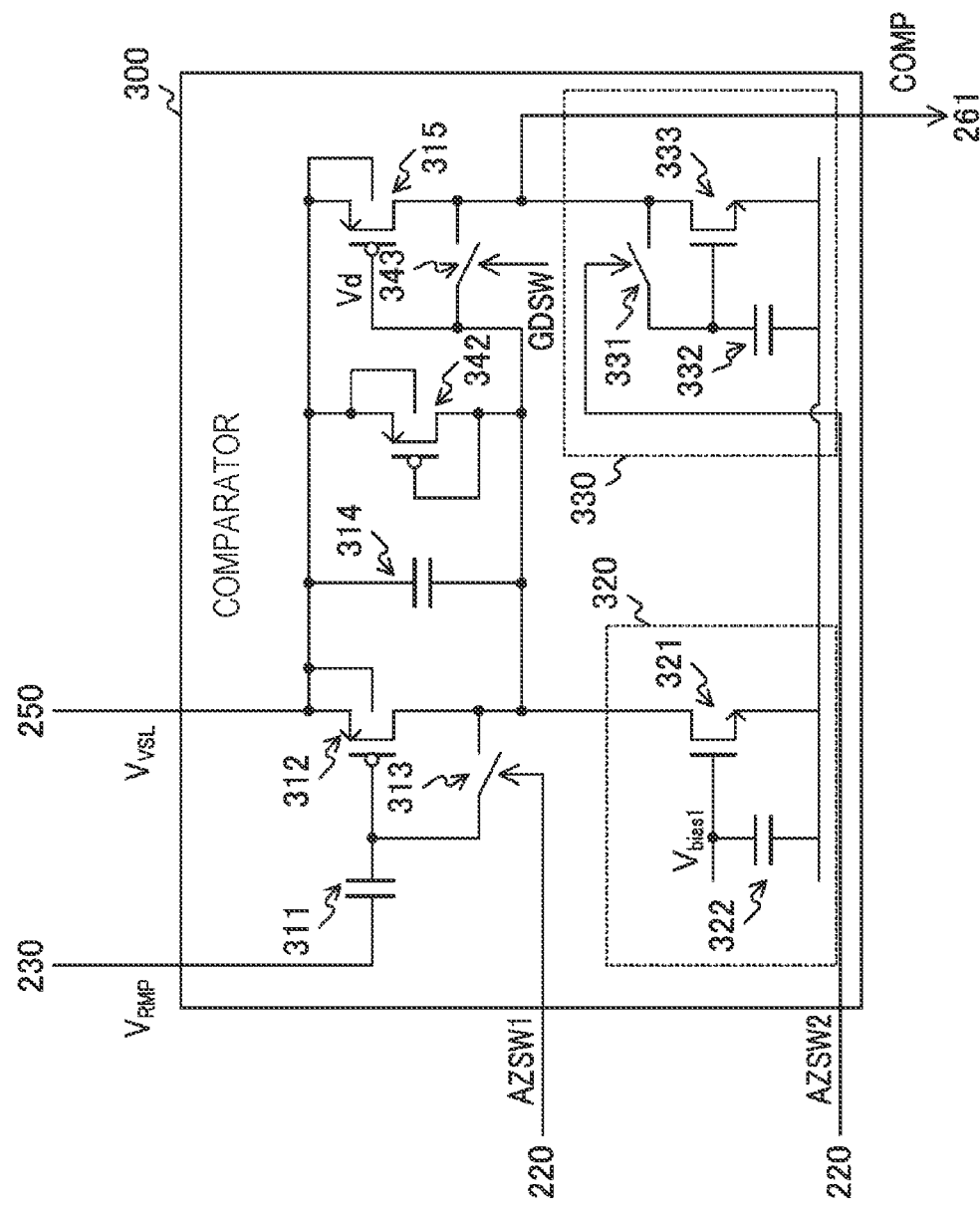
FIG. 15 is a circuit diagram illustrating a configuration example of a comparator according to a third embodiment of the present technology.

FIG. 15 is a circuit diagram illustrating a configuration example of the comparator 300 according to the third embodiment of the present technology. The comparator 300 according to the third embodiment is different from the second embodiment in arranging an auto-zero switch 331, a capacitor 332, and a current source transistor 333 in an output-side current source 330. Furthermore, a current source transistor 321 and a capacitor 322 are arranged in an input-side current source 320 of the second embodiment. As the current source transistors 321 and 333, nMOS transistors are used, for example.

The current source transistor 321 is inserted between a drain of an input transistor 312 and a reference terminal (such as a ground terminal). Furthermore, a predetermined bias voltage $V_{bias1}$ is applied to a gate of the current source transistor 321. The capacitor 322 is inserted between the gate of the current source transistor 321 and the reference terminal. Note that the bias voltage $V_{bias1}$ may be sampled and held in the capacitor 322 by a switch (not illustrated) in an initial state.

Furthermore, the current source transistor 333 is inserted between a drain of an output transistor 315 and the reference terminal. The capacitor 332 is inserted between a gate of the current source transistor 333 and the reference terminal. The auto-zero switch 331 opens and closes a path between the gate and a drain of the current source transistor 333 according to a control signal AZSW2 from a timing control unit 220. Note that the auto-zero switch 331 is an example of a first auto-zero switch described in the claims.

Figure 16:
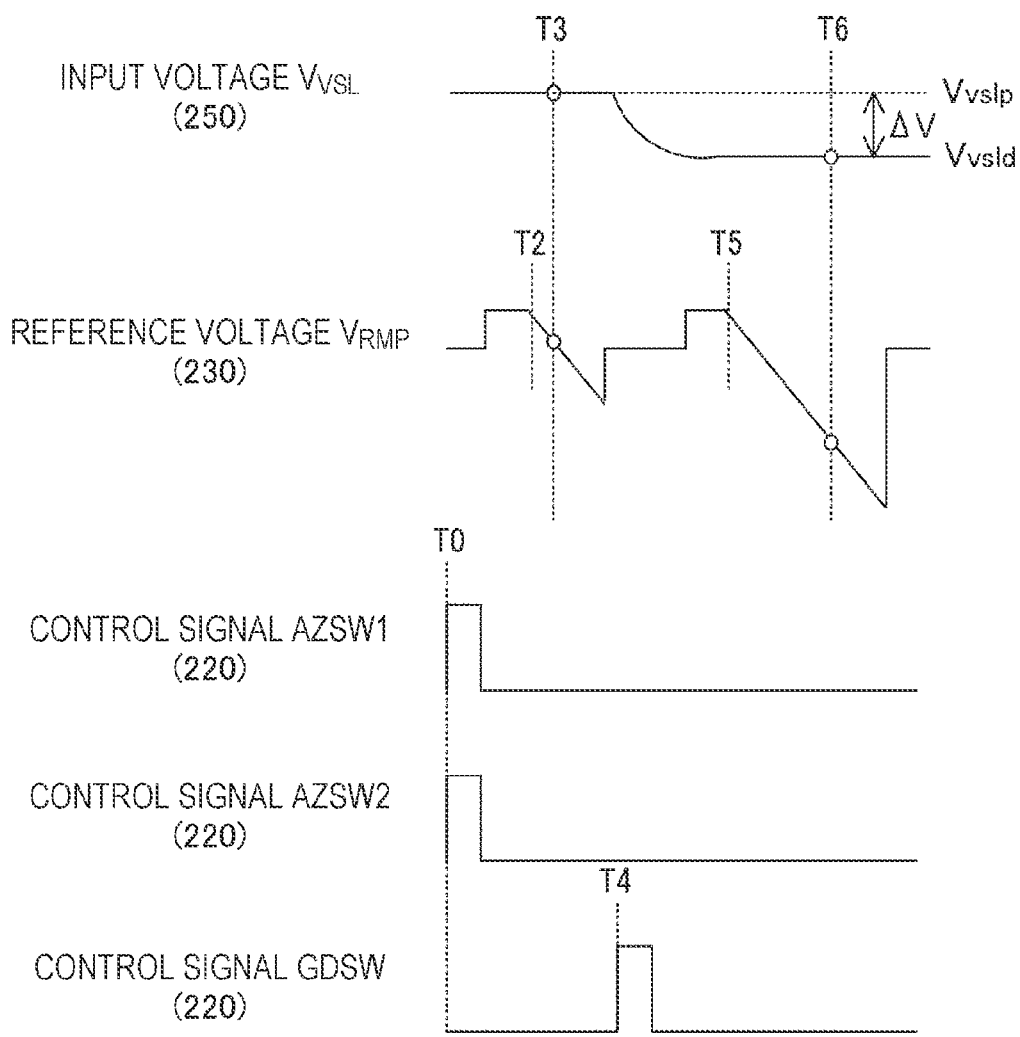
FIG. 16 is a timing chart illustrating an example of variation in input and output signals of the comparator according to the third embodiment of the present technology.

FIG. 16 is a timing chart illustrating an example of variation in input and output signals of the comparator 300 according to the third embodiment of the present technology. The timing control unit 220 further supplies a control signal AZSW2 in addition to the control signal AZSW1 over an auto-zero period from timing T0. The auto-zero switch 331 is controlled to be in a closed state by the control signal AZSW2.

Under the control of the auto-zero switch 331, the gate voltage of the current source transistor 333 is self-set on the basis of an input-side current Id1. As a result, a voltage of a comparison result COMP is stabilized regardless of variation in elements.

As described above, according to the third embodiment of the present technology, the auto-zero switch 331 short-circuits the gate and the drain of the current source transistor 333, and thus the gate voltage of the current source transistor 333 absorbs an error due to the variation and can stabilize the voltage of the comparison result COMP.

4. Fourth Embodiment

In the above-described third embodiment, the gate voltage of the output-side current source transistor 333 has been self-set during the auto-zero period. However, in this configuration, when the drain voltages of the input transistor 312 and the output transistor 315 are not uniform, there is a possibility that a current ratio of the input-side current Id1 to an output-side current Id2 deviates from an assumed value. A comparator 300 according to a fourth embodiment is different from the third embodiment in making deviation in the current ratio small by cascode-connecting transistors.

Figure 17:
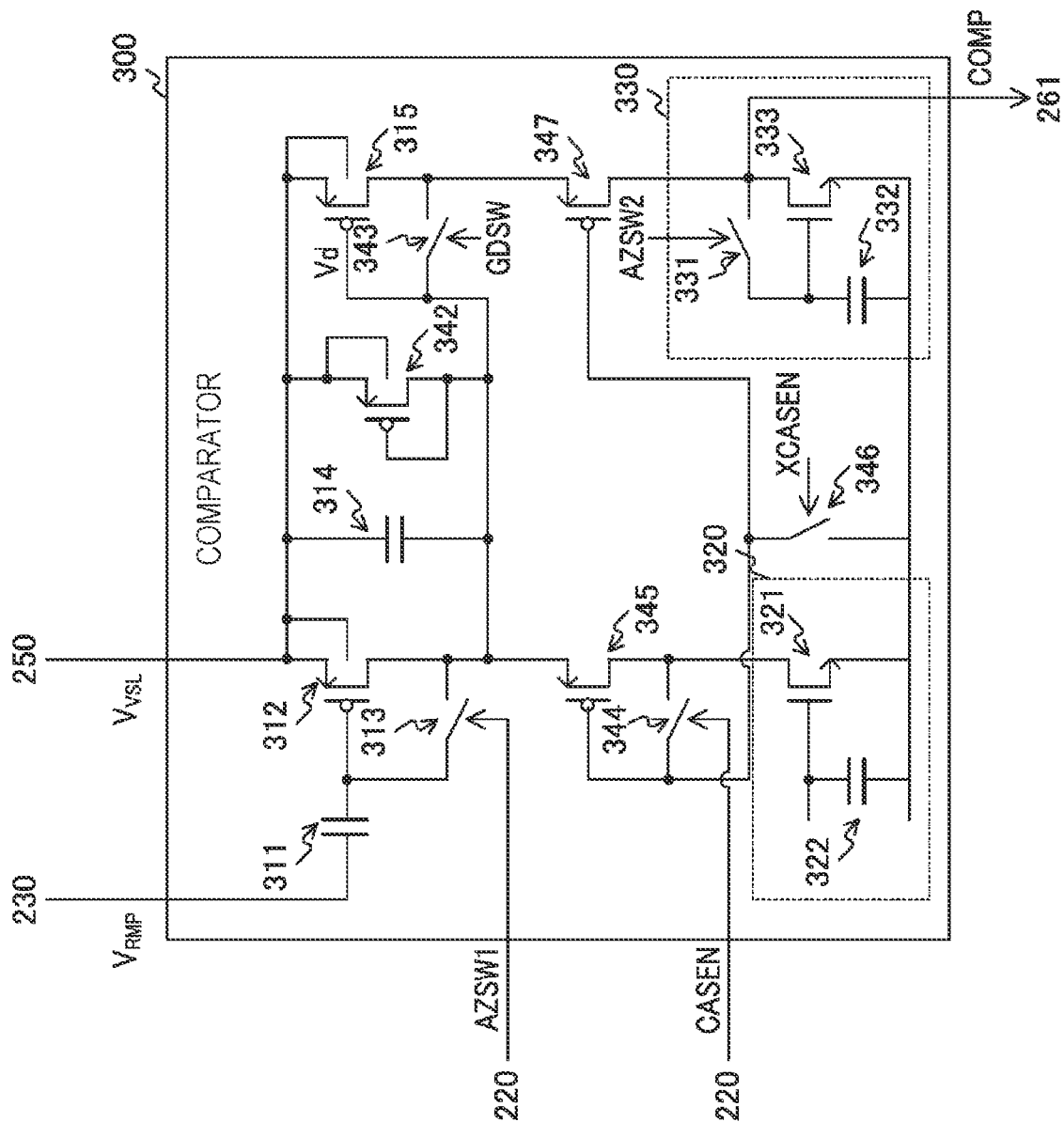
FIG. 17 is a circuit diagram illustrating a configuration example of a comparator according to a fourth embodiment of the present technology.

FIG. 17 is a circuit diagram illustrating a configuration example of the comparator 300 according to the fourth embodiment of the present technology. The comparator 300 according to the fourth embodiment is different from the third embodiment in further including an input-side cascode connection transistor 345, an output-side cascode connection transistor 347, and cascode control switches 344 and 346. As the input-side cascode connection transistor 345 and the output-side cascode connection transistor 347, pMOS transistors are used, for example.

The input-side cascode connection transistor 345 is cascode-connected to an input transistor 312. The input-side cascode connection transistor 345 is inserted between a drain of the input transistor 312 and an input-side current source 320. Furthermore, a gate of the input-side cascode connection transistor 345 is connected to a gate of the output-side cascode connection transistor 347.

The output-side cascode connection transistor 347 is cascode-connected to an output transistor 315. The output-side cascode connection transistor 347 is inserted between a drain of the output transistor 315 and an output-side current source 330.

The cascode control switch 344 opens and closes a path between the gate and a drain of the input-side cascode connection transistor 345 according to a control signal CASEN from a timing control unit 220.

The cascode control switch 346 opens and closes a path between the gates of the input-side cascode connection transistor 345 and the output-side cascode connection transistor 347 and a reference terminal according to XCASEN that is an inverted control signal CASEN.

Figure 18:
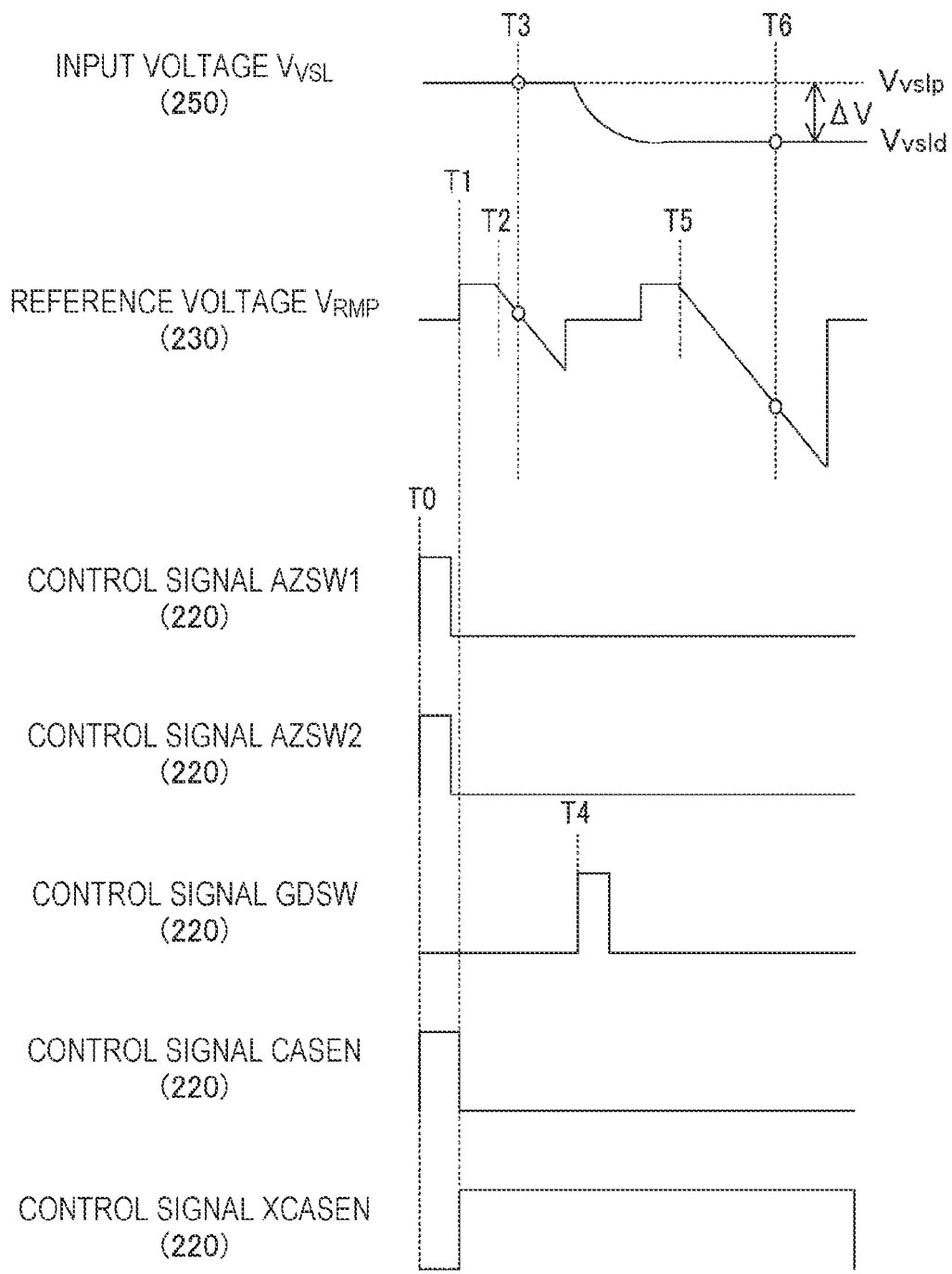
FIG. 18 is a timing chart illustrating an example of variation in input and output signals of the comparator according to the fourth embodiment of the present technology.

FIG. 18 is a timing chart illustrating an example of variation in input and output signals of the comparator 300 according to the third embodiment of the present technology. The timing control unit 220 supplies the control signals CASEN and XCASEN over a fixed period from timing T0. By these control signals CASEN and XCASEN, the cascode control switch 344 is controlled to be in a closed state, and the cascode control switch 346 is controlled to be in an open state. As a result, a drain voltage of the input transistor 312 and a drain voltage of the output transistor 315 are easily uniform, and the deviation of the current ratio of the current Id1 to the current Id2 from the assumed value can be made small.

However, if the cascode is kept connected, a dynamic range may decrease. Therefore, at timing T1 after the auto-zero period has elapsed, the cascode control switch 344 is controlled to be in the open state and the cascode control switch 346 is controlled to be in the closed state by the control signals CASEN and XCASEN. As a result, the cascode connection is released and the decrease in the dynamic range can be prevented.

As described above, according to the fourth embodiment of the present technology, the transistors are cascode-connected to the input transistor 312 and the output transistor 315, and thus the drain voltages of the transistors can be made uniform. As a result, the deviation of the current ratio of the current Id1 to the current Id2 from the assumed value can be made small.

5. Fifth Embodiment

In the above-described second embodiment, the input-side current source 320 and the output-side current source 330 have been provided. However, in a case where these current sources individually generate currents Id1 and Id2 by a bias voltage, values of the currents may vary. A solid-state image sensor 200 according to a fifth embodiment is different from the second embodiment in suppressing the variation in the currents by adding an auto-zero switch on an output side.

Figure 19:
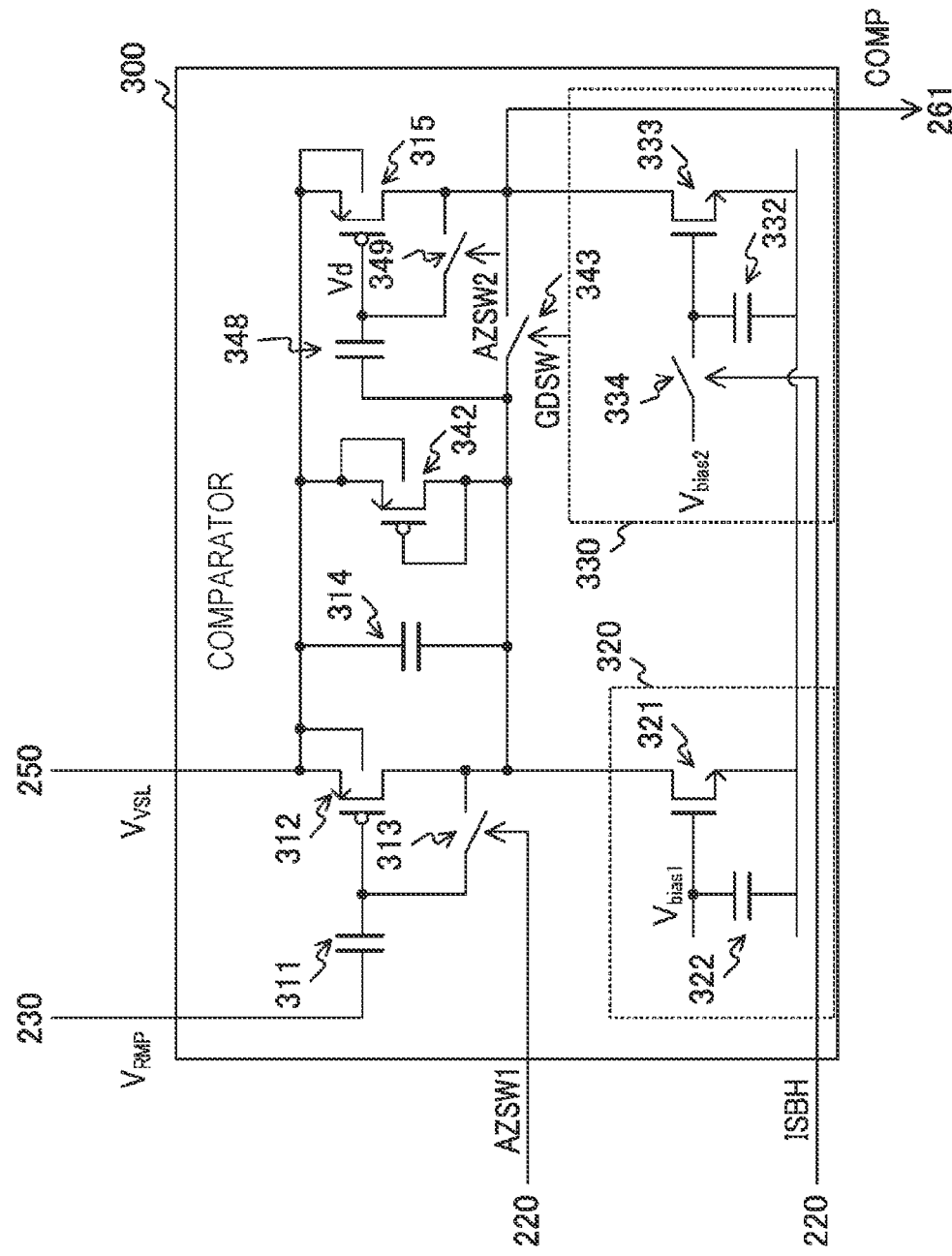
FIG. 19 is a circuit diagram illustrating a configuration example of a comparator according to a fifth embodiment of the present technology.

FIG. 19 is a circuit diagram illustrating a configuration example of a comparator 300 according to the fifth embodiment of the present technology. The comparator 300 according to the fifth embodiment is different from the second embodiment in further including a capacitor 348 and an auto-zero switch 349. Furthermore, a sample-and-hold switch 334, a capacitor 332, and a current source transistor 333 are arranged in an output-side current source 330 according to the fifth embodiment. Furthermore, a current source transistor 321 and a capacitor 322 are arranged in an input-side current source 320 according to the fifth embodiment. As the current source transistors 321 and 333, nMOS transistors are used, for example.

The current source transistor 321 is inserted between a drain of an input transistor 312 and a reference terminal. Furthermore, a predetermined bias voltage $V_{bias1}$ is applied to a gate of the current source transistor 321. The capacitor 322 is inserted between a gate of the current source transistor 321 and the reference terminal.

Furthermore, the current source transistor 333 is inserted between a drain of an output transistor 315 and the reference terminal. The capacitor 332 is inserted between a gate of the current source transistor 333 and the reference terminal. The sample-and-hold switch 334 applies a predetermined bias voltage $V_{bias2}$ to the capacitor 332 and the gate of the current source transistor 333 according to a control signal ISBH from a timing control unit 220.

Furthermore, the capacitor 348 is inserted between the drain of the input transistor 312 and a gate of the output transistor 315. The auto-zero switch 349 short-circuits the gate and the drain of the output transistor 315 according to a control signal AZSW2 from the timing control unit 220. Note that the auto-zero switch 349 is an example of a second auto-zero switch described in the claims.

Furthermore, an initialization switch 343 of the fifth embodiment opens and closes a path between the drain of the input transistor 312 and the drain of the output transistor 315 according to a control signal GDSW.

As described above, in each of the input-side current source 320 and the output-side current source 330, currents Id1 and Id2 are individually generated by the bias voltage.

Figure 20:
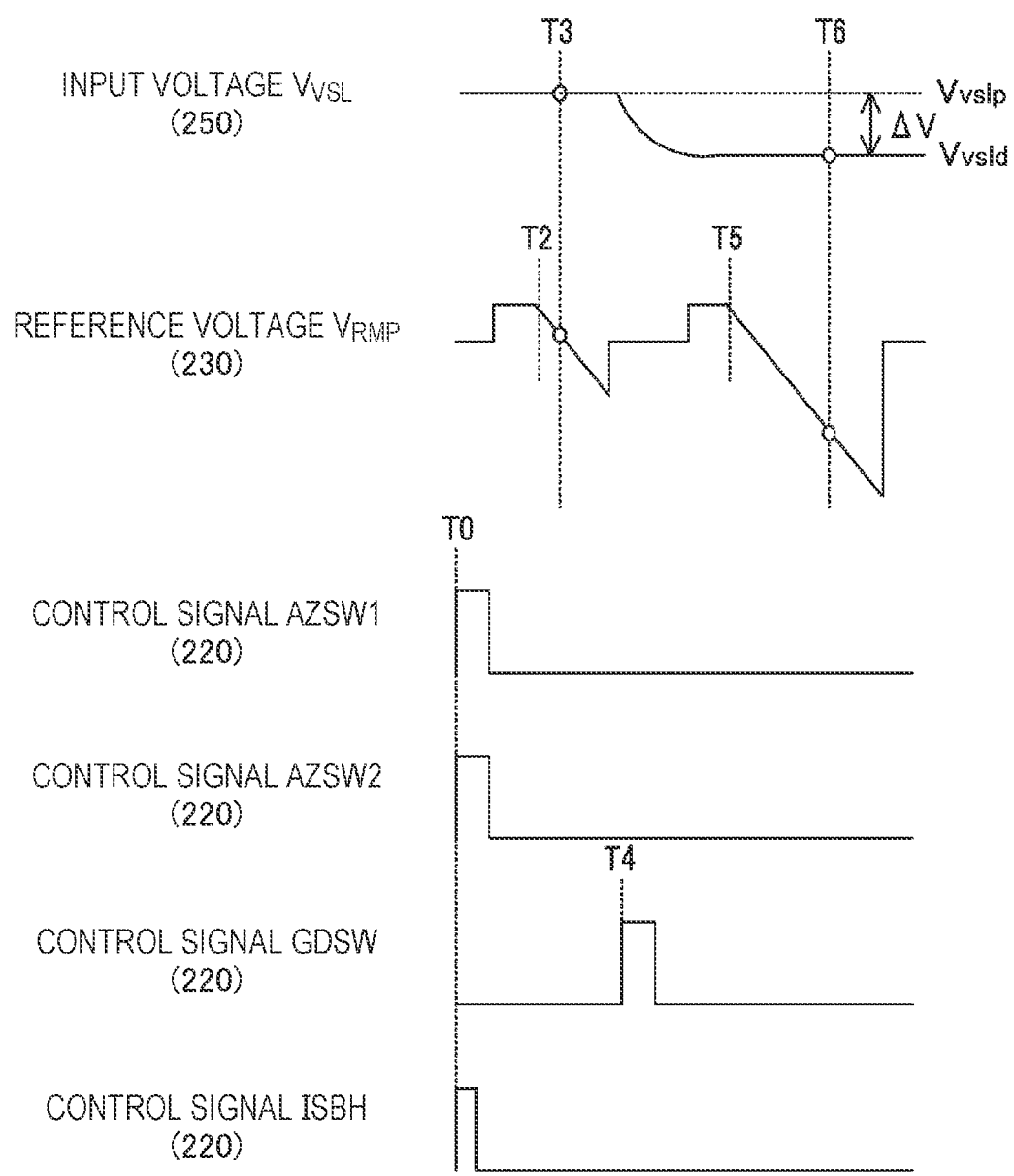
FIG. 20 is a timing chart illustrating an example of variation in input and output signals of the comparator according to the fifth embodiment of the present technology.

FIG. 20 is a timing chart illustrating an example of variation in input and output signals of the comparator 300 according to the fifth embodiment of the present technology. The timing control unit 220 further supplies a control signal ISBH in addition to the control signals AZSW1 and AZSW2 over an auto-zero period from timing T0. The output-side auto-zero switch 349 is controlled to be in a closed state by the control signal AZSW2.

Furthermore, the sample-and-hold switch 334 in the output-side current source 330 is controlled to be in a closed state by the control signal ISBH.

An influence of the variation in the currents Id1 and Id2 of when the output-side offset is decreased by the output-side auto-zero switch 349 and the currents Id1 and Id2 are individually generated by the bias voltage can be suppressed.

As described above, according to the fifth embodiment of the present technology, the auto-zero switch 349 is added to the output side, and thus the influence of the variation in the currents Id1 and Id2 of when the currents Id1 and Id2 are individually generated by the bias voltage can be suppressed.

6. Sixth Embodiment

In the above-described second embodiment, the drain voltage of the output transistor 315 has been output as it is as the comparison result COMP. However, a logic gate such as an inverter can be further added at a subsequent stage of the output transistor 315. A comparator 300 according to a sixth embodiment is different from the second embodiment in adding a logic gate.

Figure 21:
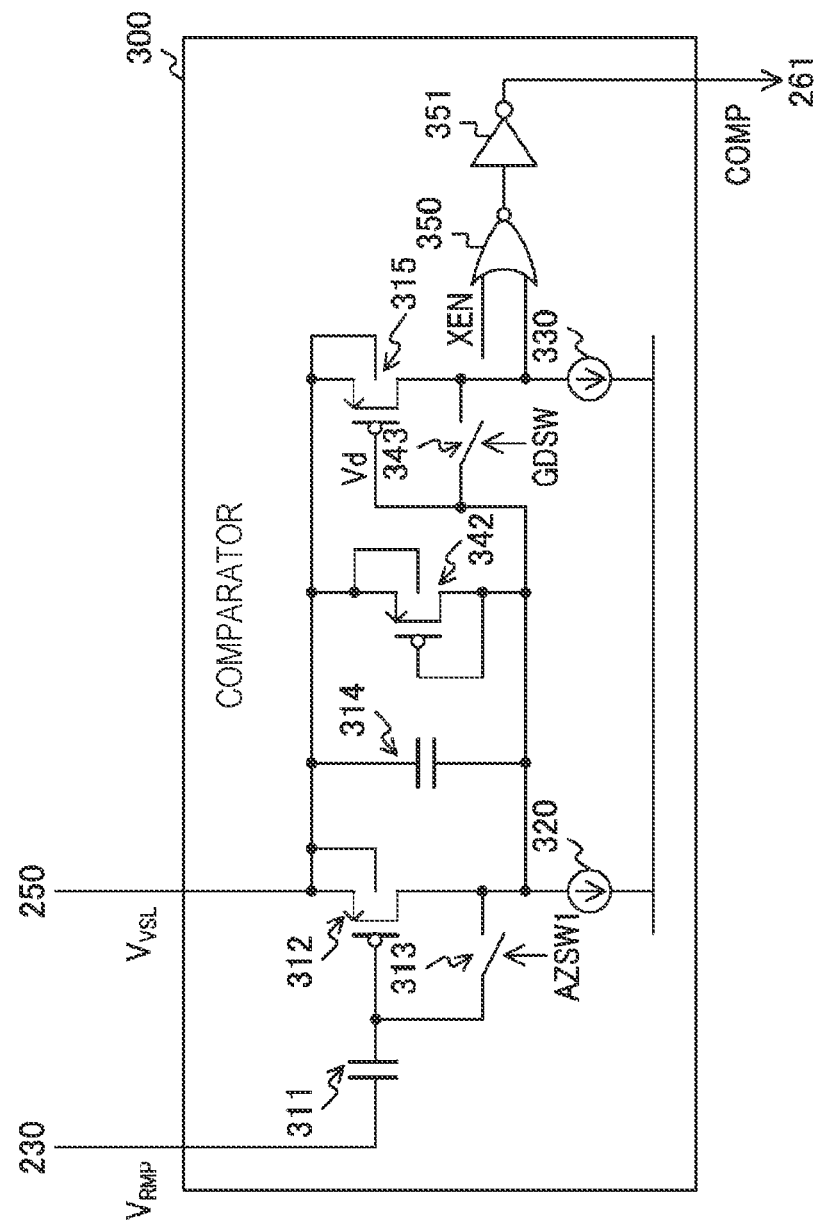
FIG. 21 is a circuit diagram illustrating a configuration example of a comparator according to a sixth embodiment of the present technology.

FIG. 21 is a circuit diagram illustrating a configuration example of the comparator 300 according to the sixth embodiment of the present technology. The comparator 300 according to the sixth embodiment is different from the second embodiment in further including a NOR gate 350 and an inverter 351.

The NOR gate 350 outputs a negative OR of a drain of an output transistor 315 and a control signal XEN to the inverter 351. The inverter 351 inverts an output of the NOR gate 350 and outputs the inverted output to a counter 261 as a comparison result COMP. Note that the NOR gate 350 and the inverter 351 are examples of logic gates described in the claims.

With the above-described configuration, a voltage of a signal path (comparison result COMP) can be set to a power supply voltage level of a logic circuit. Furthermore, the logic of the output of the NOR gate 350 is fixed during an auto-zero period or between an AD conversion period at a reset level and an AD conversion period at a signal level. As a result, even when a drain voltage of the output transistor 315 is an intermediate voltage, a through current can be prevented from flowing through the third-stage NOR gate 350.

Note that the sixth embodiment can be applied to the respective embodiments other than the second embodiment and modifications of the embodiments.

As described above, according to the sixth embodiment of the present technology, the NOR gate 350 and the inverter 351 are added to the subsequent stage of the output transistor 315, and thus the logic of the output can be fixed during the auto-zero period and the like.

7. Seventh Embodiment

In the above-described second embodiment, only one stage of input-side clamp transistor has been arranged. However, in this configuration, an output amplitude of the input transistor 312 may be insufficient. A comparator 300 according to a seventh embodiment is different from the second embodiment in that input-side clamp transistors are arranged at two stages.

Figure 22:
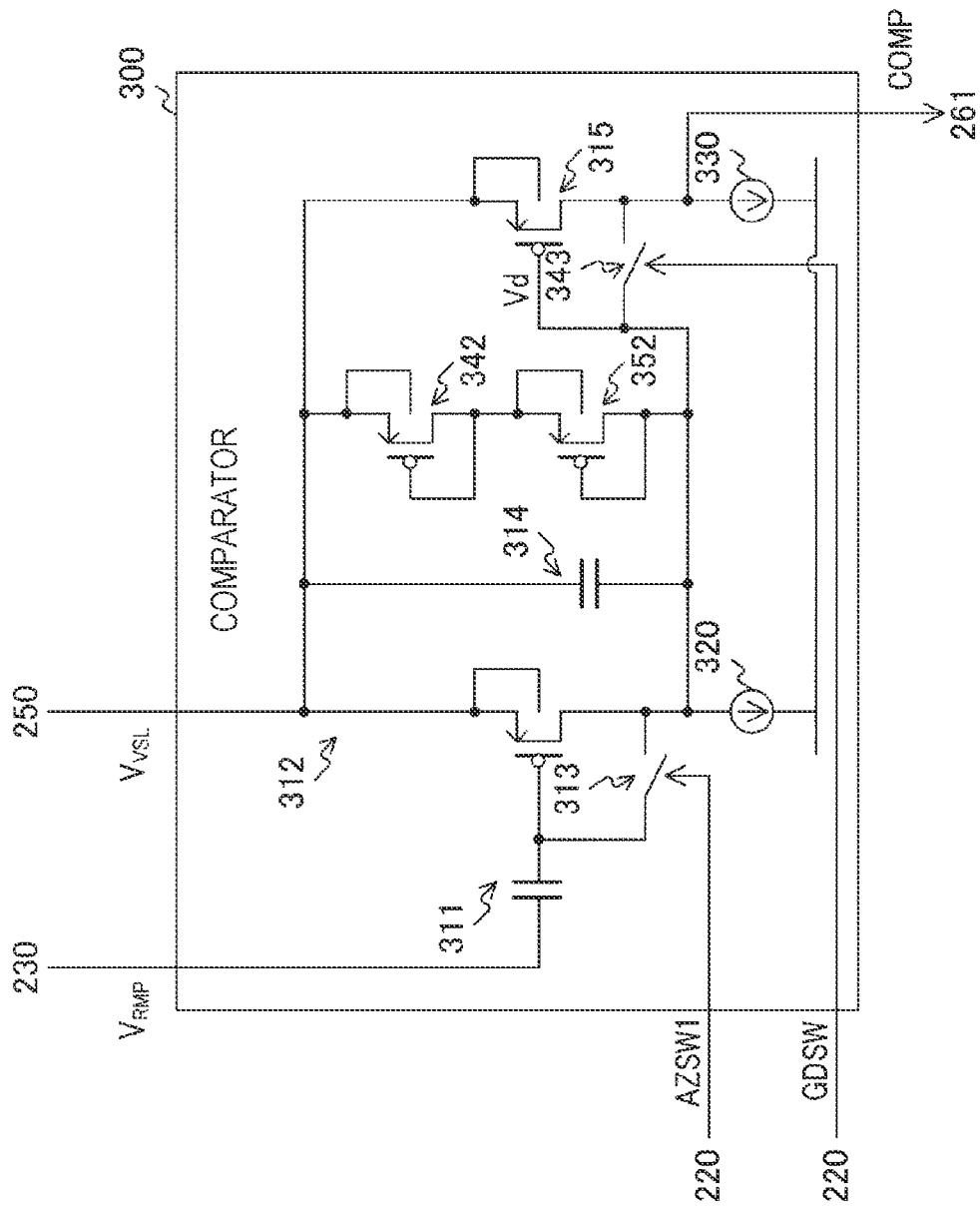
FIG. 22 is a circuit diagram illustrating a configuration example of a comparator according to a seventh embodiment of the present technology.

FIG. 22 is a circuit diagram illustrating a configuration example of the comparator 300 according to the seventh embodiment of the present technology. The comparator 300 according to the seventh embodiment is different from the second embodiment in further including an input-side clamp transistor 352.

A pMOS transistor is used as the input-side clamp transistor 352. Input-side clamp transistors 342 and 352 are connected in series between a drain and a source of an input transistor 312.

By adding the input-side clamp transistor 352, the output amplitude of the input transistor 312 becomes larger than the case of only the input-side clamp transistor 342.

With the configuration, a delay time until inversion of a comparison result COMP becomes long and noise can be reduced.

Note that the seventh embodiment can be applied to the respective embodiments other than the second embodiment and modifications of the embodiments.

As described above, according to the seventh embodiment of the present technology, the input-side clamp transistors 342 and 352 are connected in series between the drain and the source of the input transistor 312, and thus the output amplitude of the input transistor 312 can be made large.

8. Eighth Embodiment

In the above-described second embodiment, the currents Id1 and Id2 have been supplied from the input-side current source 320 and the output-side current source 330. However, in this configuration, these current amounts may become excessive. A comparator 300 according to an eighth embodiment is different from the second embodiment in adding a current source to suppress current amounts of currents Id1 and Id2.

Figure 23:
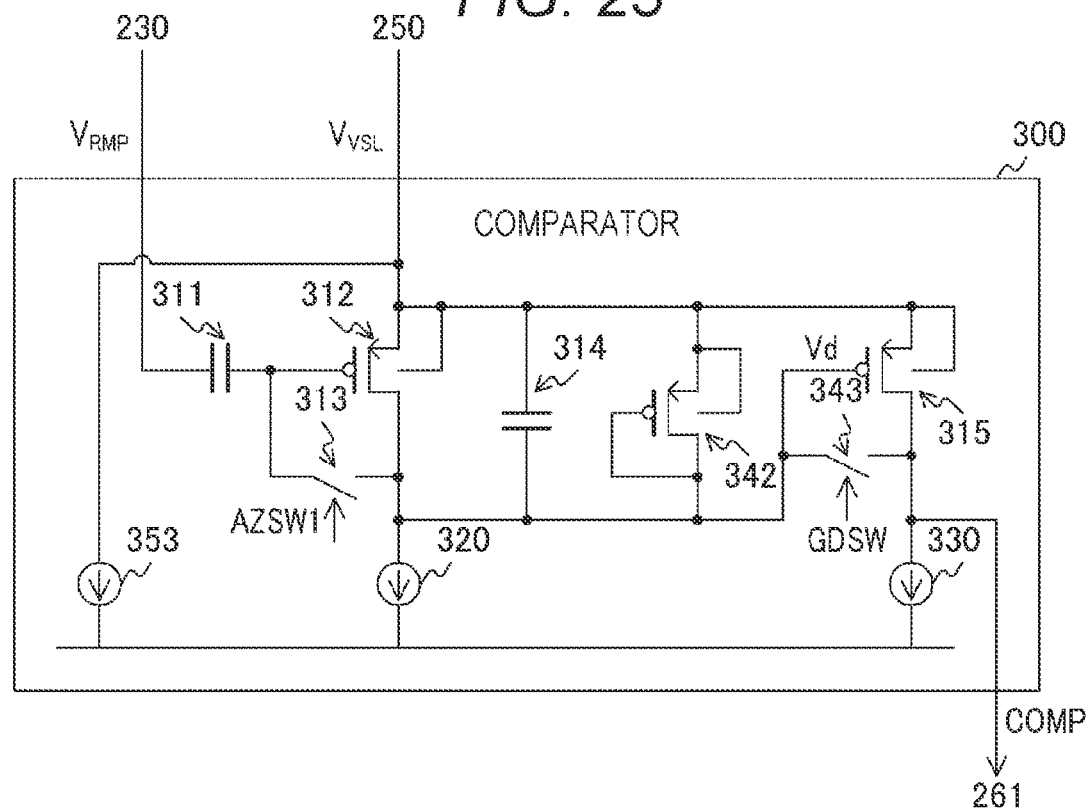
FIG. 23 is a circuit diagram illustrating a configuration example of a comparator according to an eighth embodiment of the present technology.

FIG. 23 is a circuit diagram illustrating a configuration example of the comparator 300 according to the eighth embodiment of the present technology. The comparator 300 according to the eighth embodiment is different from the second embodiment in further including a pixel-side current source 353.

The pixel-side current source 353 is connected between the vertical signal line VSL and the reference terminal. The current amounts of the currents Id1 and Id2 can be decreased by the amount of a current supplied by the pixel-side current source 353.

Note that the eighth embodiment can be applied to the respective embodiments other than the second embodiment and modifications of the embodiments.

As described above, according to the eighth embodiment of the present technology, the pixel-side current source 353 is connected to a vertical signal line VSL, and thus the current amounts of the currents Id1 and Id2 can be suppressed.

9. Ninth Embodiment

In the above-described second embodiment, the pMOS transistor has been used as the input-side clamp transistor. However, an nMOS transistor can also be used. A comparator 300 according to the ninth embodiment is different from the second embodiment in using an nMOS transistor as an input-side clamp transistor.

Figure 24:
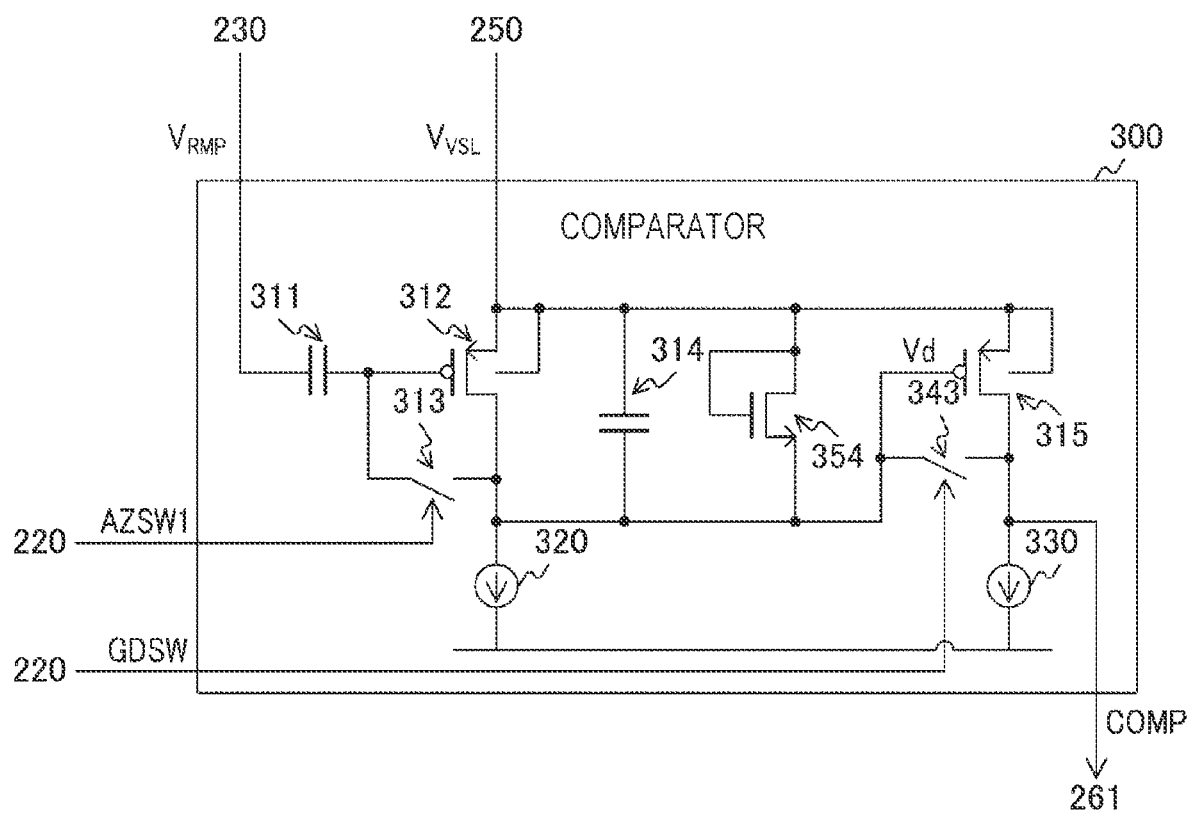
FIG. 24 is a circuit diagram illustrating a configuration example of a comparator according to a ninth embodiment of the present technology.

FIG. 24 is a circuit diagram illustrating a configuration example of the comparator 300 according to the ninth embodiment of the present technology. The comparator 300 of the ninth embodiment is different from the second embodiment in including an input-side clamp transistor 354 instead of the input-side clamp transistor 342. As the input-side clamp transistor 354, an nMOS transistor is used. A gate and a drain of the input-side clamp transistor 354 are short-circuited.

Note that the ninth embodiment can be applied to the respective embodiments other than the second embodiment and modifications of the embodiments.

As described above, according to the ninth embodiment of the present technology, the input-side clamp transistor 354 is an nMOS transistor, and thus a lower limit of a drain voltage Vd can be limited by the nMOS transistor.

[Modification]

In the above-described ninth embodiment, the gate and the drain of the input-side clamp transistor 354 have been short-circuited. However, in this configuration, the lower-limit voltage limited by the input-side clamp transistor 354 is determined on the basis of a voltage of a vertical signal line VSL. For this reason, a margin of the lower-limit voltage for suppressing stop of supply of the current Id1 needs to be increased, and a dynamic range may be decreased by the margin. Furthermore, since an output amplitude of an input transistor 312 is small, noise easily becomes large. A comparator 300 according to a modification of the ninth embodiment is different from the ninth embodiment in limiting a lower limit of a drain voltage Vd by a bias voltage.

Figure 25:
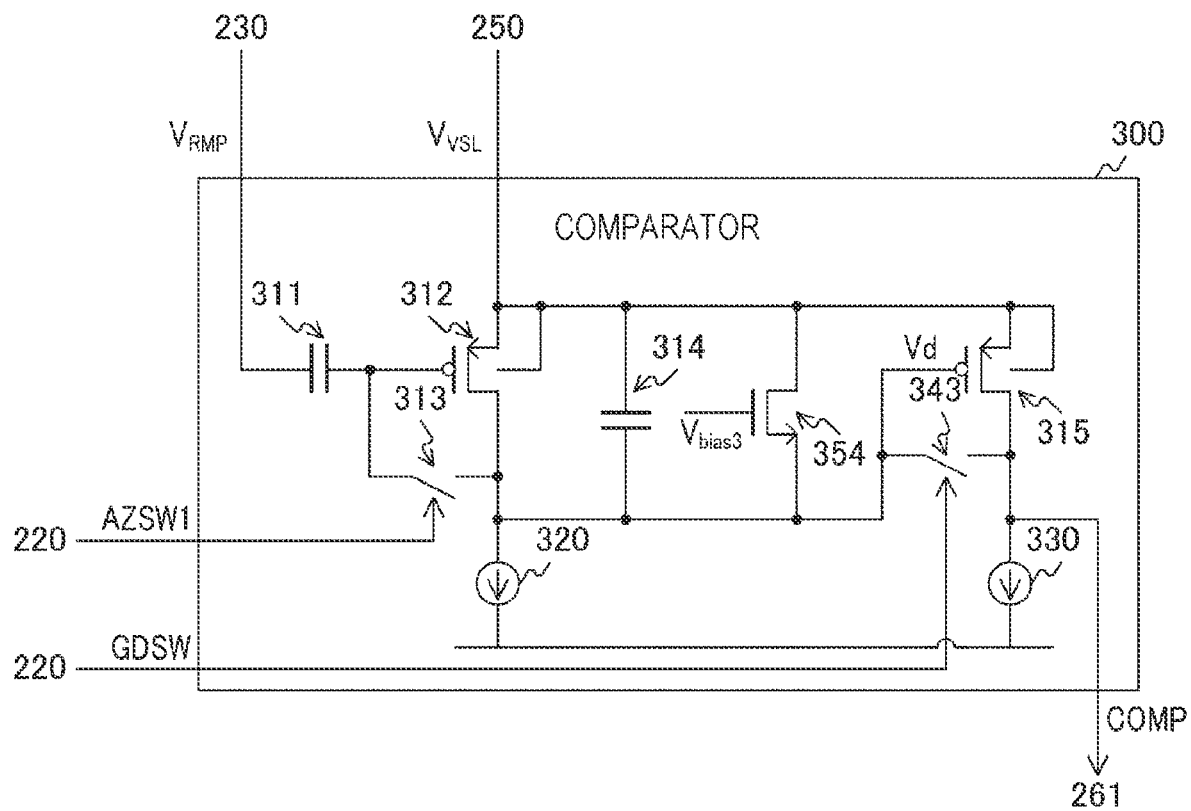
FIG. 25 is a circuit diagram illustrating a configuration example of a comparator according to a modification of the ninth embodiment of the present technology.

FIG. 25 is a circuit diagram illustrating a configuration example of the comparator 300 according to the modification of the ninth embodiment of the present technology. The comparator 300 according to the modification of the ninth embodiment is different from the ninth embodiment in that a bias voltage $V_{bias3}$ is applied to a gate of the input-side clamp transistor 354.

By the application of the bias voltage $V_{bias3}$, the lower limit of the drain voltage Vd is limited regardless of the voltage of the vertical signal line VSL, and the stop of the supply of the current Id1 of the drain can be directly prevented.

Note that, in a case where the problems of the dynamic range and noise do not occur, a configuration without using a bias voltage can be adopted, as illustrated in FIG. 24. In the configuration in FIG. 24, the lower-limit voltage to be limited is linked with the voltage of the vertical signal line VSL, and thus dependence of a maximum amplitude of a gate-source voltage of the output transistor 315 on a signal level is suppressed, and a linearity error and a gain error can be decreased, as compared with the configuration in FIG. 25.

As described above, according to the modification of the ninth embodiment, the lower limit of the drain voltage Vd is limited by the bias voltage, and thus the decrease in the dynamic range and deterioration of the noise can be suppressed.

10. Tenth Embodiment

In the above-described second embodiment, the input transistor 312 in the comparator 300 has been connected with the DAC 230 via the capacitor 311. However, in this configuration, a kickback from the comparator 300 in a certain column to the DAC 230 may interfere with a column adjacent to the column via a signal line for transmitting the reference signal. A comparator 300 according to a tenth embodiment is different from the second embodiment in adding a buffer between a capacitor 311 and an DAC 230.

Figure 26:
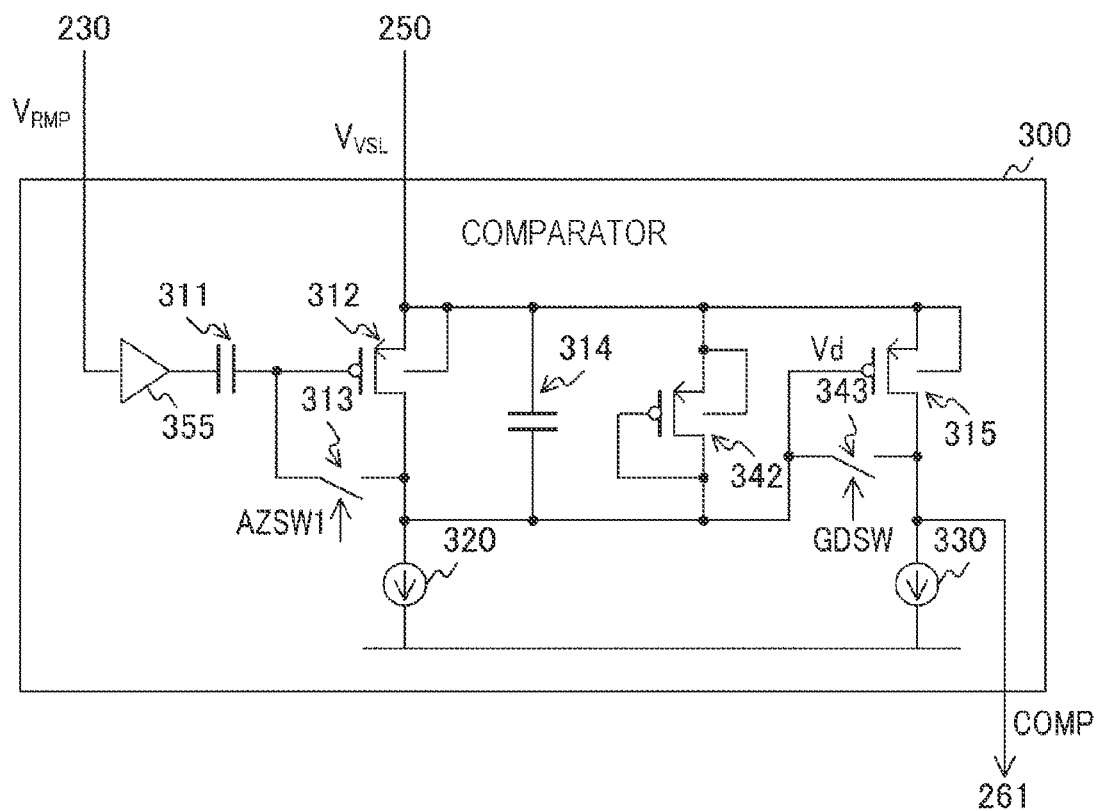
FIG. 26 is a circuit diagram illustrating a configuration example of a comparator according to a tenth embodiment of the present technology.

FIG. 26 is a circuit diagram illustrating a configuration example of the comparator 300 according to the tenth embodiment of the present technology. The comparator 300 according to the tenth embodiment is different from the second embodiment in further including a buffer 355.

The buffer 355 is inserted between the DAC 230 and the capacitor 311. Note that the buffer 355 is arranged for each column, but the arrangement is not limited to this configuration. For example, the buffer 355 can be arranged for each of a plurality of columns.

The buffer 355 can make a load of the comparator 300 invisible to the DAC 230. Furthermore, a kickback from the comparator 300 in a certain column can be prevented from interfering with a column adjacent to the column via a signal line for transmitting a reference signal.

Note that the tenth embodiment can be applied to the respective embodiments other than the second embodiment and modifications of the embodiments.

As described above, according to the tenth embodiment of the present technology, the buffer 355 is inserted between the DAC 230 and the capacitor 311, and thus the kickback of a certain column can be prevented from interfering with an adjacent column.

11. Eleventh Embodiment

In the above-described second embodiment, the lower limit of the drain voltage Vd of the input transistor 312 has been limited by the input-side clamp transistor 342. However, the state of the transistor constituting the output-side current source 330 becomes a non-conducting state due to the decrease in the drain voltage of the output transistor 315, and the supply of the current Id2 may be stopped. A comparator 300 according to an eleventh embodiment is different from the second embodiment in adding an output-side clamp transistor to limit a lower limit of a drain voltage of an output transistor 315.

Figure 27:
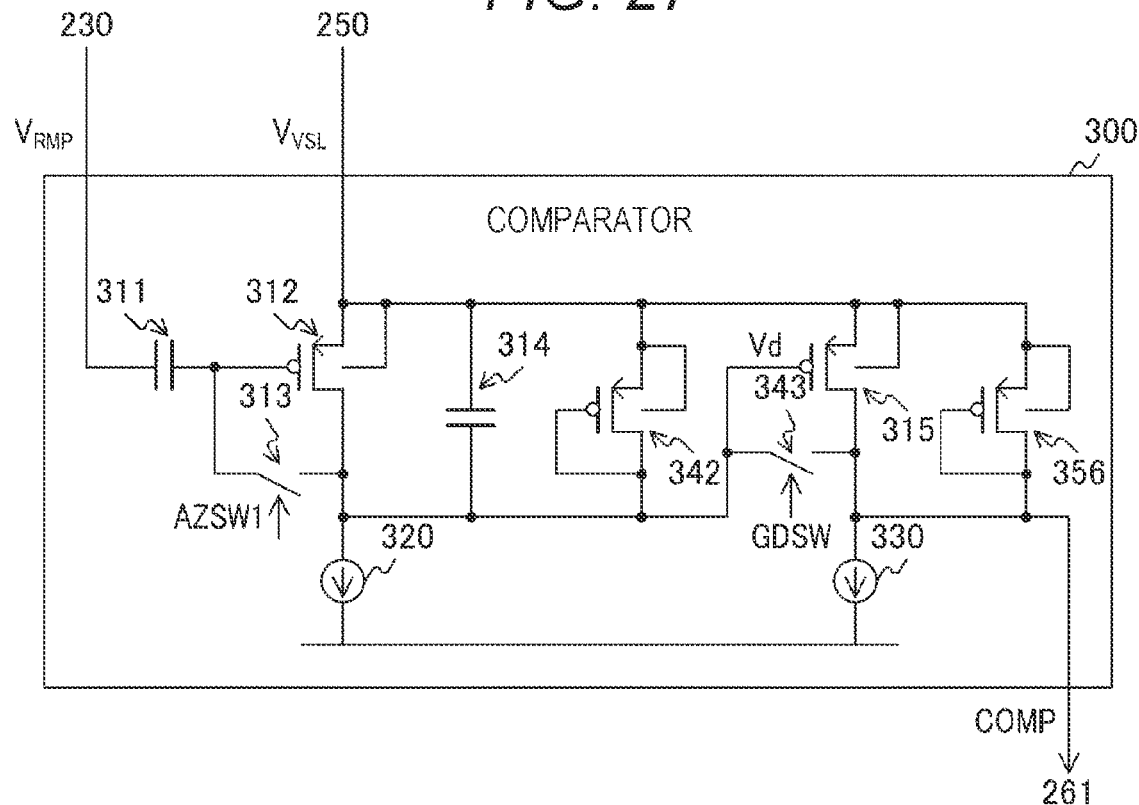
FIG. 27 is a circuit diagram illustrating a configuration example of a comparator according to an eleventh embodiment of the present technology.

FIG. 27 is a circuit diagram illustrating a configuration example of the comparator 300 according to the eleventh embodiment of the present technology. The comparator 300 according to the eleventh embodiment is different from the second embodiment in further including an output-side clamp transistor 356.

The output-side clamp transistor 356 is inserted between a source and a drain of an output transistor 315. A pMOS transistor is used as the output-side clamp transistor 356, and a gate of the output-side clamp transistor 356 is short-circuited with a drain of the output-side clamp transistor 356. Furthermore, a back gate and the source of the output-side clamp transistor 356 are desirably short-circuited. By adding the output-side clamp transistor 356, the decrease in the drain voltage of the output transistor 315 is suppressed, and stop of supply of a drain current Id2 can be prevented.

Note that the eleventh embodiment can be applied to the respective embodiments other than the second embodiment and modifications of the embodiments.

As described above, the output-side clamp transistor 356 suppresses the decrease in the drain voltage of the output transistor 315, and thus the stop of the supply of the drain current Id2 can be prevented.

[Modification]

In the above-described eleventh embodiment, the pMOS transistor has been used as the output-side clamp transistor. However, an nMOS transistor can also be used. A comparator 300 according to a modification of the eleventh embodiment is different from the eleventh embodiment in using an nMOS transistor as an output-side clamp transistor.

Figure 28:
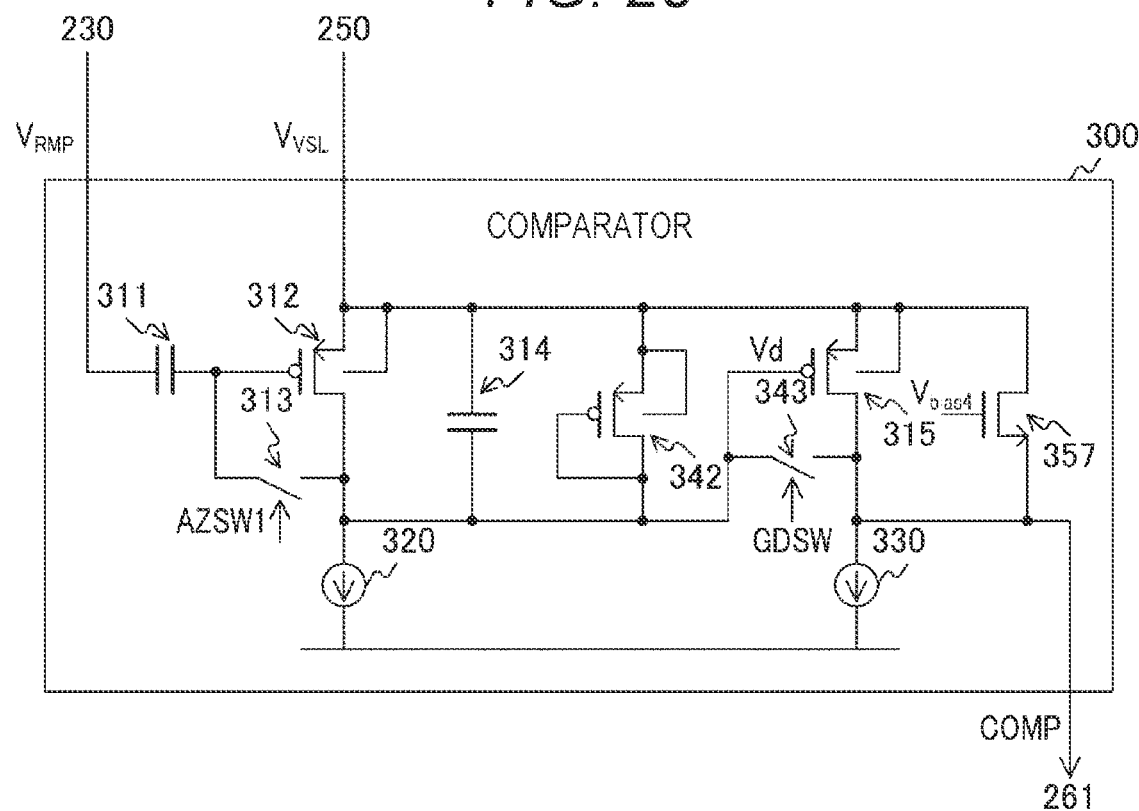
FIG. 28 is a circuit diagram illustrating a configuration example of a comparator according to a modification of the eleventh embodiment of the present technology.

FIG. 28 is a circuit diagram illustrating a configuration example of the comparator 300 according to the modification of the eleventh embodiment of the present technology. The comparator 300 according to the modification of the eleventh embodiment is different from the eleventh embodiment in including an output-side clamp transistor 357 instead of the output-side clamp transistor 356.

As the output-side clamp transistor 357, an nMOS transistor is used. Furthermore, a predetermined bias voltage $V_{bias4}$ is applied to a gate of the output-side clamp transistor 357.

Note that the gate and a drain of the output-side clamp transistor 357 in FIG. 28 can be short-circuited like the input-side clamp transistor 354 illustrated in FIG. 24.

As described above, since the output-side clamp transistor 357 is an nMOS transistor in the modification of the eleventh embodiment of the present technology, the lower limit of the drain voltage of the output transistor 315 can be limited by the nMOS transistor.

12. Twelfth Embodiment

In the above-described first embodiment, the input-side current source 320 has been connected to the drain of the input transistor 312. However, in this configuration, when the input transistor 312 is in the non-conducting state, the drain voltage Vd is lowered, and the state of the transistor constituting the input-side current source 320 becomes a non-conducting state, and the supply of the drain current Id1 may be stopped. A comparator 300 according to a twelfth embodiment is different from the comparator 300 according to the first embodiment in preventing the stop of the supply of the drain current Id1 by adding a clamp switch.

Figure 29:
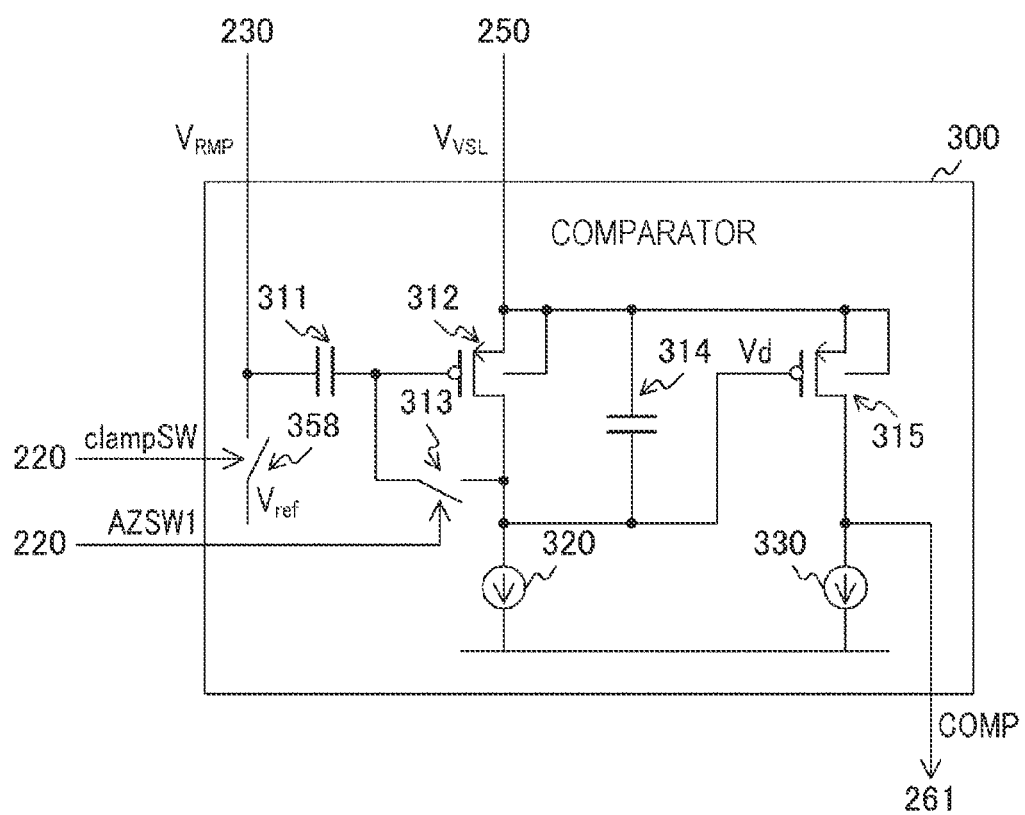
FIG. 29 is a circuit diagram illustrating a configuration example of a comparator according to a twelfth embodiment of the present technology.

FIG. 29 is a circuit diagram illustrating a configuration example of the comparator 300 according to the twelfth embodiment of the present technology. The comparator 300 according to the twelfth embodiment is different from the first embodiment in further including a clamp switch 358.

The clamp switch 358 supplies a predetermined lower-limit voltage Vref to a connection node of a DAC 230 and a capacitor 311 according to a control signal clampSW from a timing control unit 220.

Figure 30:
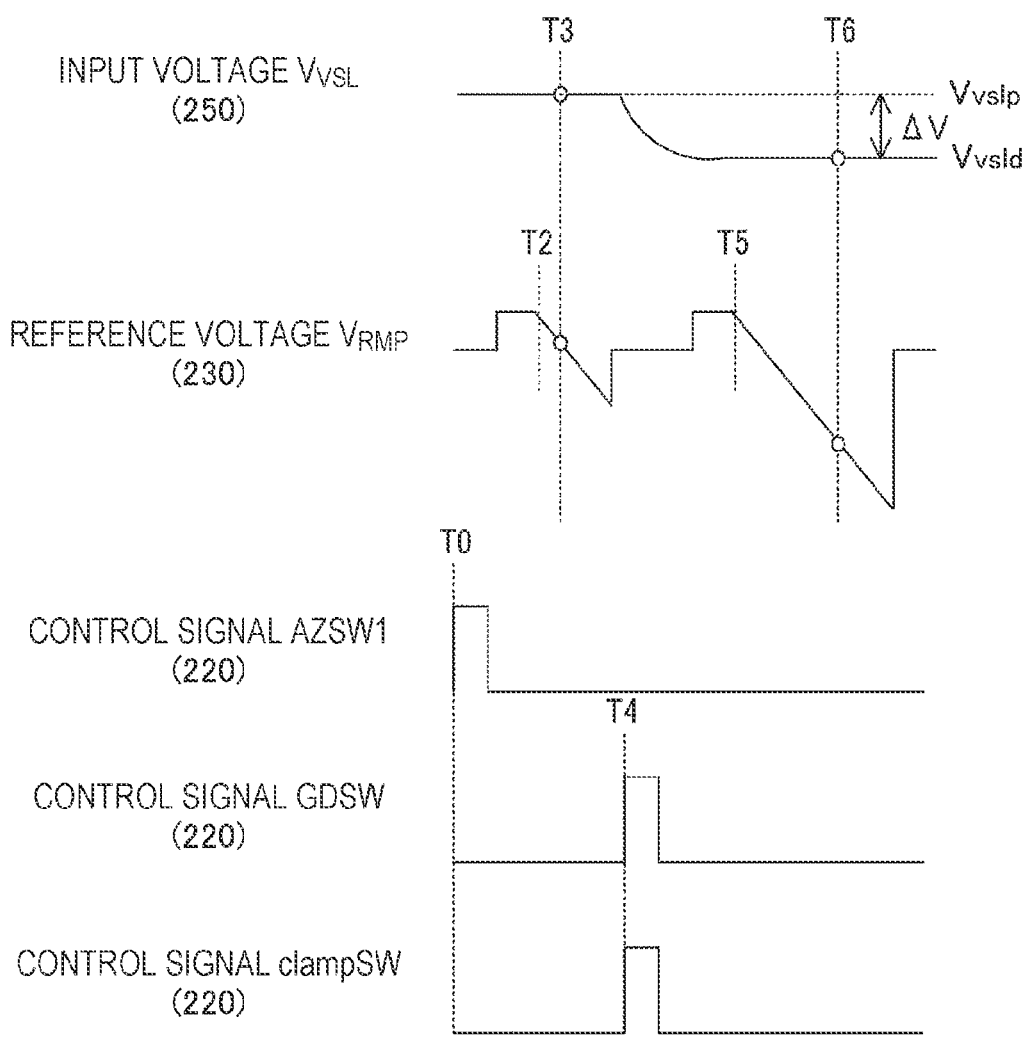
FIG. 30 is a timing chart illustrating an example of variation in input and output signals of the comparator according to the twelfth embodiment of the present technology.

FIG. 30 is a timing chart illustrating an example of variation in input and output signals of the comparator 300 according to the twelfth embodiment of the present technology. The timing control unit 220 supplies the control signal clampSW over a pulse period from timing T4. The clamp switch 358 is controlled to be in a closed state by the control signal clampSW. As a result, the lower-limit voltage Vref is supplied, the input transistor 312 is turned on regardless of an input voltage $V_{VSL}$, and a decrease in a drain voltage Vd can be suppressed.

As described above, according to the twelfth embodiment of the present technology, the clamp switch 358 suppresses the decrease in the drain voltage Vd, thereby preventing stop of supply of a drain current Id1.

13. Thirteenth Embodiment

In the above-described second embodiment, the input-side clamp transistor 342 has been inserted between the source and the drain of the input transistor 312 to limit the lower limit of the drain voltage Vd. However, adjustment of the lower-limit voltage may be difficult only with the input-side clamp transistor 342. A comparator 300 according to a thirteenth embodiment is different from the second embodiment in adjusting a lower-limit voltage with a resistive element.

Figure 31:
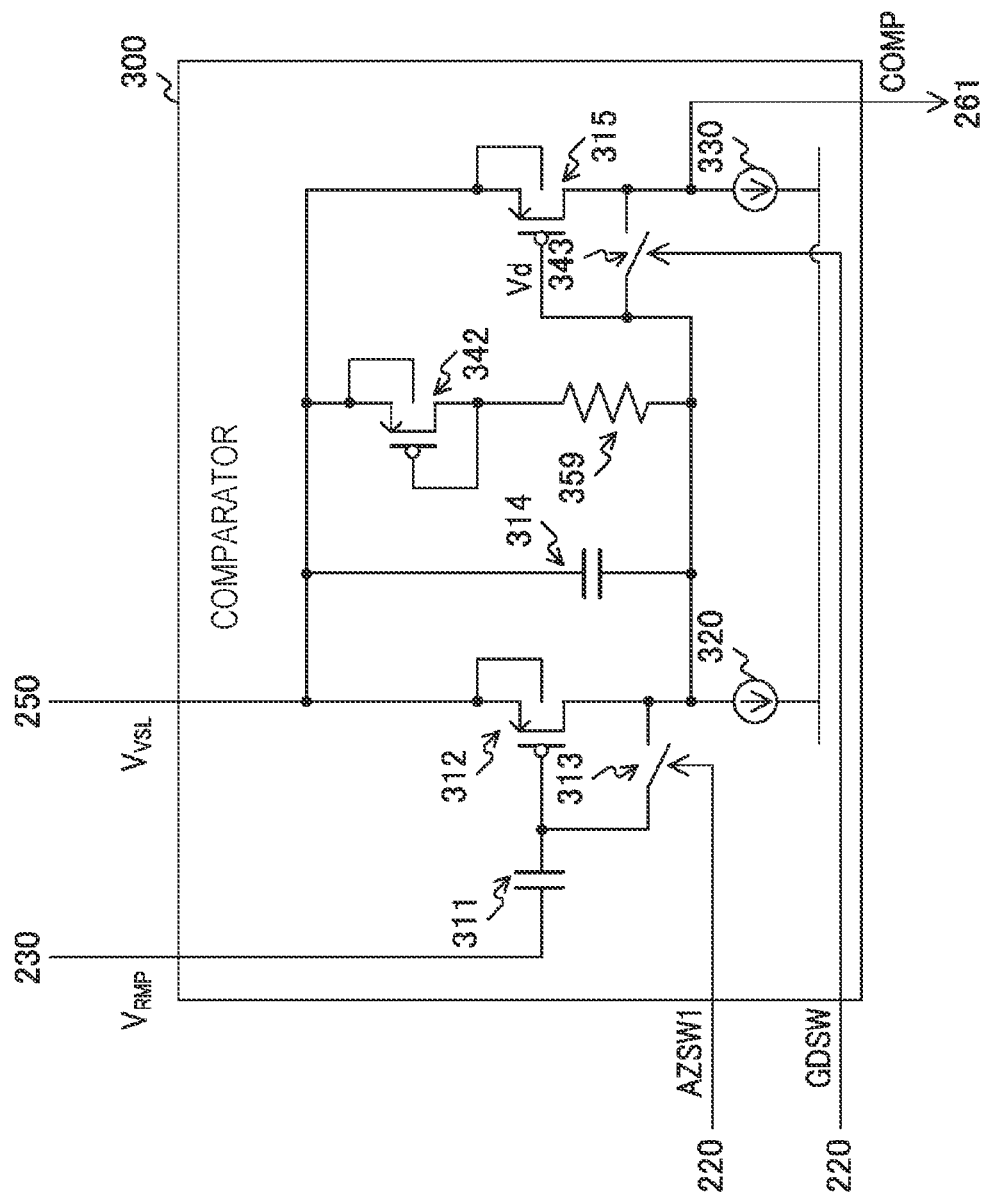
FIG. 31 is a circuit diagram illustrating a configuration example of a comparator according to a thirteenth embodiment of the present technology.

FIG. 31 is a circuit diagram illustrating a configuration example of the comparator 300 according to the thirteenth embodiment of the present technology. The comparator 300 according to the thirteenth embodiment is different from the second embodiment in further including a resistive element 359.

An input-side clamp transistor 342 and the resistive element 359 are connected in series between a source and a drain of an input transistor 312. This resistive element 359 may be a variable resistive element. In the case of being adopted as the variable resistive element, a resistance value of the variable resistive element is held in a register or the like. By adjusting the resistance value of the resistive element 359, a lower-limit voltage to be limited can be set to an optimum value. Furthermore, the resistive element 359 may be mounted by using an active element as the resistive element.

Note that the thirteenth embodiment can be applied to the respective embodiments other than the second embodiment and modifications of the embodiments.

As described above, according to the thirteenth embodiment of the present technology, the resistive element 359 is added, and thus the lower-limit voltage can be set to the optimum value by adjusting the resistance value of the resistive element 359.

<14. Application To Moving Body>

The technology according to the present disclosure (present technology) can be applied to various products. For example, the technology according to the present disclosure may be realized as a device mounted on any type of moving bodies including an automobile, an electric automobile, a hybrid electric automobile, a motorcycle, a bicycle, a personal mobility, an airplane, a drone, a ship, a robot, and the like.

Figure 32:
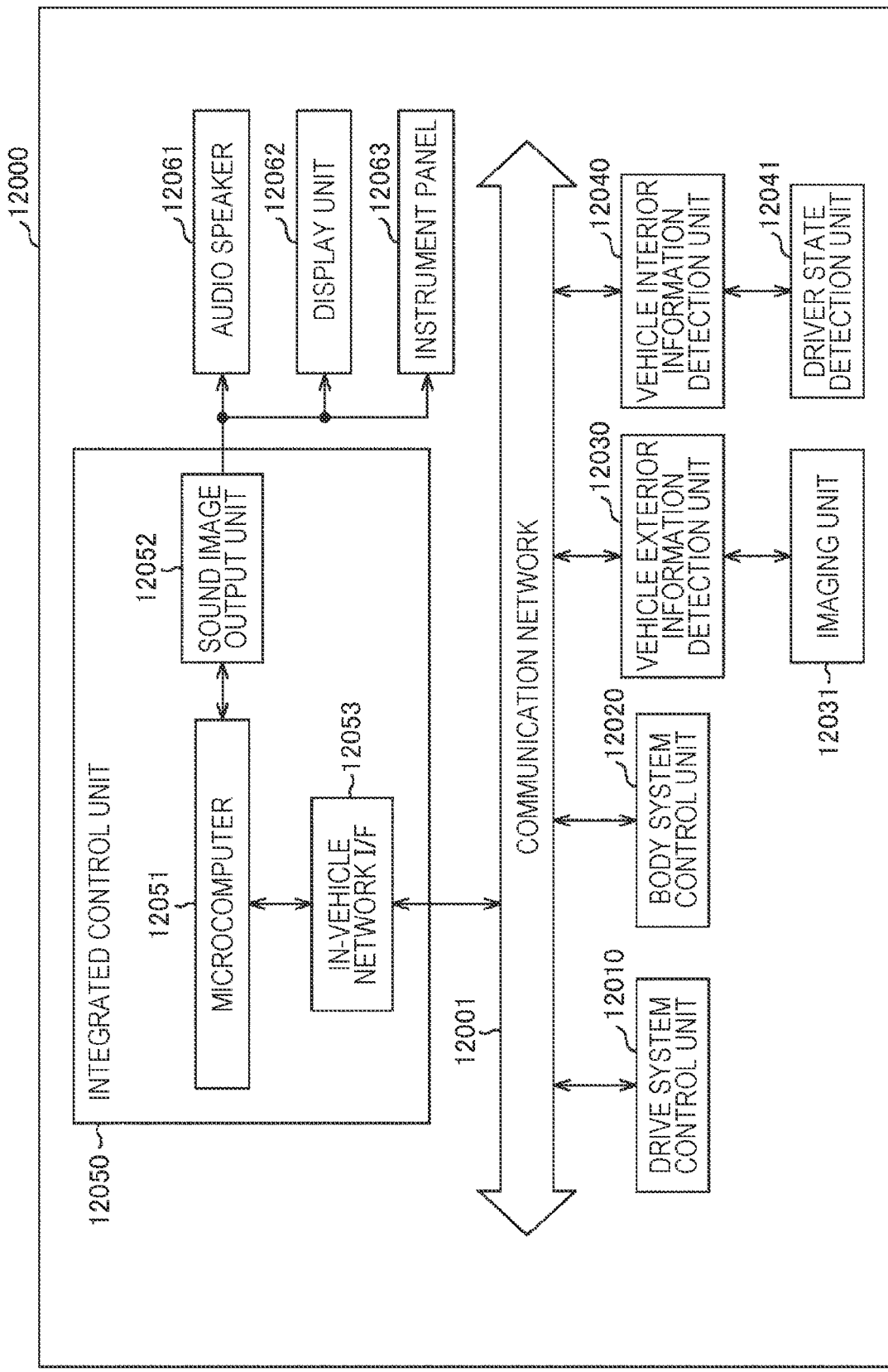
FIG. 32 is a block diagram illustrating a schematic configuration of a vehicle control system.

FIG. 32 is a block diagram illustrating a schematic configuration example of a vehicle control system as an example of a moving body control system to which the technology according to the present disclosure is applicable.

A vehicle control system 12000 includes a plurality of electronic control units connected through a communication network 12001. In the example illustrated in FIG. 32, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, a sound image output unit 12052, and an in-vehicle network interface (I/F) 12053 are illustrated.

The drive system control unit 12010 controls operations of devices regarding a drive system of a vehicle according to various programs. For example, the drive system control unit 12010 functions as a control device of a drive force generation device for generating drive force of a vehicle, such as an internal combustion engine or a drive motor, a drive force transmission mechanism for transmitting drive force to wheels, a steering mechanism that adjusts a steering angle of a vehicle, a braking device that generates braking force of a vehicle, and the like.

The body system control unit 12020 controls operations of various devices equipped in a vehicle body according to various programs. For example, the body system control unit 12020 functions as a control device of a keyless entry system, a smart key system, an automatic window device, and various lamps such as head lamps, back lamps, brake lamps, turn signals, and fog lamps. In this case, radio waves transmitted from a mobile device substituted for a key or signals of various switches can be input to the body system control unit 12020. The body system control unit 12020 receives an input of the radio waves or the signals, and controls a door lock device, the automatic window device, the lamps, and the like of the vehicle.

The vehicle exterior information detection unit 12030 detects information outside the vehicle that mounts the vehicle control system 12000. For example, an imaging unit 12031 is connected to the vehicle exterior information detection unit 12030. The vehicle exterior information detection unit 12030 causes the imaging unit 12031 to image an image outside the vehicle, and receives the imaged image. The vehicle exterior information detection unit 12030 may perform object detection processing or distance detection processing of persons, vehicles, obstacles, signs, letters on a road surface, or the like on the basis of the received image.

The imaging unit 12031 is an optical sensor that receives light and outputs an electrical signal according to the amount of received light. The imaging unit 12031 can output the electrical signal as an image and can output the electrical signal as information of distance measurement. Furthermore, the light received by the imaging unit 12031 may be visible light or may be non-visible light such as infrared light.

The vehicle interior information detection unit 12040 detects information inside the vehicle. A driver state detection unit 12041 that detects a state of a driver is connected to the vehicle interior information detection unit 12040, for example. The driver state detection unit 12041 includes a camera that captures the driver, for example, and the vehicle interior information detection unit 12040 may calculate the degree of fatigue or the degree of concentration of the driver, or may determine whether or not the driver falls asleep on the basis of the detection information input from the driver state detection unit 12041.

The microcomputer 12051 calculates a control target value of the drive power generation device, the steering mechanism, or the braking device on the basis of the information outside and inside the vehicle acquired in the vehicle exterior information detection unit 12030 or the vehicle interior information detection unit 12040, and can output a control command to the drive system control unit 12010. For example, the microcomputer 12051 can perform cooperative control for the purpose of realization of an advanced driver assistance system (ADAS) function including collision avoidance or shock mitigation of the vehicle, following travel based on an inter-vehicle distance, vehicle speed maintaining travel, collision warning of the vehicle, lane out warning of the vehicle, and the like.

Furthermore, the microcomputer 12051 controls the drive force generation device, the steering mechanism, the braking device, or the like on the basis of the information of a vicinity of the vehicle acquired in the vehicle exterior information detection unit 12030 or the vehicle interior information detection unit 12040 to perform cooperative control for the purpose of automatic drive of autonomous travel without depending on an operation of the driver or the like.

Furthermore, the microcomputer 12051 can output a control command to the body system control unit 12020 on the basis of the information outside the vehicle acquired in the vehicle exterior information detection unit 12030. For example, the microcomputer 12051 can perform cooperative control for the purpose of achievement of non-glare such as by controlling the head lamps according to the position of a leading vehicle or an oncoming vehicle detected in the vehicle exterior information detection unit 12030, and switching high beam light to low beam light.

The sound image output unit 12052 transmits an output signal of at least one of a sound or an image to an output device that can visually and aurally notify a passenger of the vehicle or an outside of the vehicle of information. In the example in FIG. 32, as the output device, an audio speaker 12061, a display unit 12062, and an instrument panel 12063 are exemplarily illustrated. The display unit 12062 may include, for example, at least one of an on-board display or a head-up display.

Figure 33:
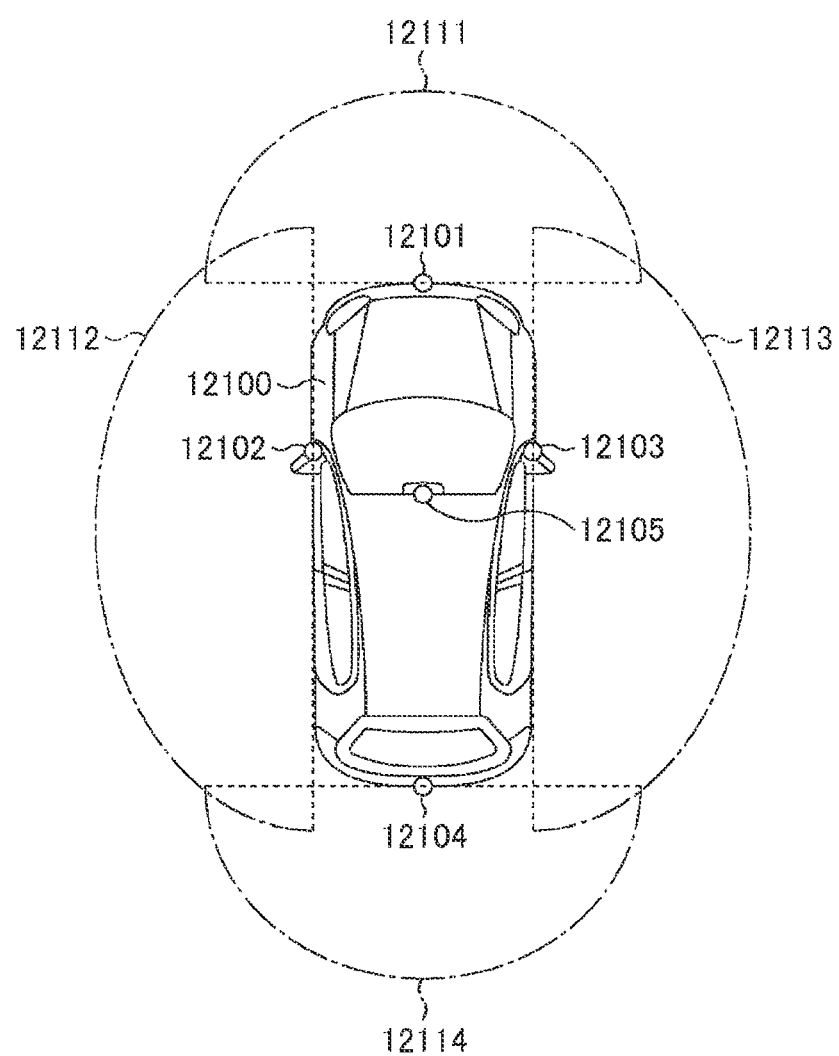
FIG. 33 is an explanatory diagram illustrating an example of an installation position of an imaging unit.

FIG. 33 is a diagram illustrating an example of an installation position of the imaging unit 12031.

In FIG. 33, imaging units 12101, 12102, 12103, 12104, and 12105 are included as the imaging unit 12031.

The imaging units 12101, 12102, 12103, 12104, and 12105 are provided at positions such as a front nose, side mirrors, a rear bumper or a back door, and an upper portion of a windshield in an interior of the vehicle 12100, for example. The imaging unit 12101 provided at the front nose and the imaging unit 12105 provided at an upper portion of the windshield in an interior of the vehicle mainly acquire front images of the vehicle 12100. The imaging units 12102 and 12103 provided at the side mirrors mainly acquire side images of the vehicle 12100. The imaging unit 12104 provided at the rear bumper or the back door mainly acquires a rear image of the vehicle 12100. The imaging unit 12105 provided at the upper portion of the windshield in the interior of the vehicle is mainly used for detecting a preceding vehicle, a pedestrian, an obstacle, a traffic signal, a traffic sign, a lane, or the like.

Note that FIG. 33 illustrates an example of capture ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposing image data captured by the imaging units 12101 to 12104.

At least one of the imaging units 12101 to 12104 may have a function to acquire distance information. For example, at least one of the imaging units 12101 to 12104 may be a stereo camera including a plurality of imaging elements or may be an imaging element having pixels for phase difference detection.

For example, the microcomputer 12051 obtains distances to three-dimensional objects in the imaging ranges 12111 to 12114 and temporal change of the distances (relative speeds to the vehicle 12100) on the basis of the distance information obtained from the imaging units 12101 to 12104, thereby to extract particularly a three-dimensional object closest to the vehicle 12100 on a traveling road and traveling at a predetermined speed (for example, 0 km/h or more) in substantially the same direction as the vehicle 12100 as a leading vehicle. Moreover, the microcomputer 12051 can set an inter-vehicle distance to be secured from the leading vehicle in advance and perform automatic braking control (including following stop control) and automatic acceleration control (including following start control), and the like. In this way, the cooperative control for the purpose of automatic drive of autonomous travel without depending on an operation of the driver or the like can be performed.

For example, the microcomputer 12051 classifies three-dimensional object data regarding three-dimensional objects into two-wheeled vehicles, ordinary cars, large vehicles, pedestrians, and other three-dimensional objects such as electric poles to be extracted, on the basis of the distance information obtained from the imaging units 12101 to 12104, and can use the data for automatic avoidance of obstacles. For example, the microcomputer 12051 discriminates obstacles around the vehicle 12100 into obstacles visually recognizable by the driver of the vehicle 12100 and obstacles visually unrecognizable by the driver. Then, the microcomputer 12051 determines a collision risk indicating a risk of collision with each of the obstacles, and can perform drive assist for collision avoidance by outputting warning to the driver through the audio speaker 12061 or the display unit 12062, and performing forced deceleration or avoidance steering through the drive system control unit 12010, in a case where the collision risk is a set value or more and there is a collision possibility.

At least one of the imaging units 12101 to 12104 may be an infrared camera that detects infrared light. For example, the microcomputer 12051 determines whether or not a pedestrian exists in the imaged images of the imaging units 12101 to 12104, thereby to recognize the pedestrian. Such recognition of a pedestrian is performed by a process of extracting characteristic points in the imaged images of the imaging units 12101 to 12104, as the infrared camera, for example, and by a process of performing pattern matching processing for the series of characteristic points indicating a contour of an object and discriminating whether or not the object is a pedestrian. When the microcomputer 12051 determines that a pedestrian exists in the imaged images of the imaging units 12101 to 12104 and recognizes the pedestrian, the sound image output unit 12052 causes the display unit 12062 to superimpose and display a square contour line for emphasis on the recognized pedestrian. Furthermore, the sound image output unit 12052 may cause the display unit 12062 to display an icon or the like representing the pedestrian at a desired position.

An example of a vehicle control system to which the technology according to the present disclosure is applicable has been described. The technology according to the present disclosure is applicable to the imaging unit 12031, of the above-described configurations. Specifically, the imaging device 100 in FIG. 1 can be applied to the imaging unit 12031. By applying the technology according to the present disclosure to the imaging unit 12031, a more easily viewable captured image can be obtained, and thus the driver's fatigue can be reduced.

Note that the above-described embodiments describe an example for embodying the present technology, and the matters in the embodiments and the matters used to specify the technology in the claims have correspondence, respectively. Similarly, the matters used to specify the technology in the claims and the matters in the embodiment of the present technology given the same names have correspondence, respectively. However, the present technology is not limited to the embodiments, and can be embodied by application of various modifications to the embodiments without departing from the gist of the present technology.

Note that the effects described in the present specification are merely examples and are not limited, and other effects may be exhibited.

Note that the present technology can also have the following configurations.

(1) A solid-state image sensor including:
an input transistor configured to output, from a drain, a drain voltage according to an input voltage input to a source in a case where the input voltage substantially coincides with a predetermined reference voltage input to a gate; and
an output transistor configured to output a signal indicating whether or not a difference between the input voltage input to a source and the drain voltage input to a gate exceeds a predetermined threshold voltage as a comparison result between the input voltage and the reference voltage.

(2) The solid-state image sensor according to (1), further including:
an input-side current source connected to the drain of the input transistor; and
an input-side clamp transistor configured to limit a lower limit of the drain voltage.

(3) The solid-state image sensor according to (2), in which the input-side clamp transistor is inserted between the source of the input transistor and a power supply terminal.

(4) The solid-state image sensor according to (2), in which the input-side clamp transistor is inserted between the source and the drain of the input transistor.

(5) The solid-state image sensor according to any one of (2) to (4), in which
the input-side clamp transistor is a P-type transistor.

(6) The solid-state image sensor according to any one of (2) to (4), in which
the input-side clamp transistor is an N-type transistor, and a gate and a drain of the input-side clamp transistor are short-circuited.

(7) The solid-state image sensor according to any one of (2) to (4), in which
the input-side clamp transistor is an N-type transistor, and a bias voltage is applied to a gate of the input-side clamp transistor.

(8) The solid-state image sensor according to (2), in which
the input-side clamp transistor includes a plurality of transistors connected in series between the source and the drain of the input transistor.

(9) The solid-state image sensor according to any one of (2) to (8), further including:
a resistive element, in which the input-side clamp transistor and the resistive element are connected in series between the source and the drain of the input transistor.

(10) The solid-state image sensor according to any one of (1) to (9), further including:
an output-side current source connected to a drain of the output transistor; and an output-side clamp transistor configured to limit a lower limit of a drain voltage of the output transistor.

(11) The solid-state image sensor according to (10), in which
the output-side clamp transistor is a P-type transistor.

(12) The solid-state image sensor according to (10), in which
the output-side clamp transistor is an N-type transistor.

(13) The solid-state image sensor according to (1), further including:
a reference voltage supply unit configured to supply the reference voltage via a predetermined connection node to the gate of the input transistor; and
a clamp switch configured to supply a predetermined lower-limit voltage to the connection node according to a predetermined control signal.

(14) The solid-state image sensor according to any one of (1) to (13), further including:
an initialization switch configured to open and close a path between the gate and a drain of the output transistor.

(15) The solid-state image sensor according to any one of (1) to (14), further including:
an output-side current source connected to a drain of the output transistor, in which
the output-side current source includes
a current source transistor inserted between the drain of the output transistor and a predetermined reference terminal,
a capacitor connected to a gate of the current source transistor, and
a first auto-zero switch configured to open and close a path between the gate and a drain of the current source transistor.

(16) The solid-state image sensor according to (15), further including:
an input-side cascode connection transistor cascode-connected to the drain of the input transistor; and an output-side cascode connection transistor cascode-connected to the drain of the output transistor.

(17) The solid-state image sensor according to (1), further including:
a capacitor inserted between the drain of the input transistor and the gate of the output transistor; and
a second auto-zero switch configured to short-circuit a path between the gate and a drain of the output transistor.

(18) The solid-state image sensor according to any one of (1) to (17), further including:
a logic gate configured to perform a predetermined logic operation, in which
the output transistor outputs the comparison result via the logic gate.

(19) The solid-state image sensor according to any one of (1) to (18), further including:
a pixel circuit configured to input the input voltage via a predetermined vertical signal line to the source of the input transistor; and
a pixel-side current source connected to the vertical signal line.

(20) The solid-state image sensor according to any one of (1) to (19), further including:
a reference voltage supply unit configured to supply the reference voltage; and
a buffer inserted between the gate of the input transistor and the reference voltage supply unit.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

100 Imaging device
110 Optical unit
120 DSP circuit
130 Display unit
140 Operation unit
150 Bus
160 Frame memory
170 Storage unit
180 Power supply unit
200 Solid-state image sensor
205 Pad
210 Vertical scanning circuit
220 Timing control unit
230 DAC
240 Pixel array unit
250 Pixel circuit
251 Photoelectric conversion element
252 Transfer transistor
253 Reset transistor
254 Floating diffusion layer
255 Amplification transistor
256 Selection transistor
260 Column signal processing unit
261 Counter
262 Latch
270 Horizontal scanning circuit
280 Connection portion
290 Interface
300 Comparator
311, 314, 322, 332, 348 Capacitor
312 Input transistor
313, 331, 349 Auto-zero switch
315 Output transistor
320 Input-side current source
321, 333 Current source transistor
330 Output-side current source
334 Sample-and-hold switch
341, 342, 352, 354 Input-side clamp transistor
343 Initialization switch
344, 346 Cascode control switch
345 Input-side cascode connection transistor
347 Output-side cascode connection transistor
350 NOR (negative OR) gate
351 Inverter
353 Pixel-side current source
355 Buffer
356, 357 Output-side clamp transistor
358 Clamp switch
359 Resistive element
12031 Imaging unit

The invention claimed is:
1. An imaging device comprising:
a pixel circuit configured to output a pixel signal;

a pixel signal line coupled to the pixel circuit;
a reference signal generation circuit configured to output a reference signal; and
a comparator including:
- a first transistor, wherein a first terminal of the first transistor is coupled to the reference signal generation circuit and a second terminal of the first transistor is coupled to the pixel signal line, and
- a second transistor, wherein a first terminal of the second transistor is coupled to a drain of the first transistor and a second terminal of the second transistor is electrically connected to the pixel signal line.

2. The imaging device according to claim 1, wherein the second terminal of the first transistor and the second terminal of the second transistor are configured to receive a voltage, the voltage corresponding to the pixel signal.

3. The imaging device according to claim 1, the comparator including:
a third transistor coupled to a power supply line.

4. The imaging device according to claim 3, wherein a gate of the third transistor is configured to receive a bias voltage.

5. The imaging device according to claim 1, the comparator including:
a third transistor, wherein a gate of the third transistor is coupled to the drain of the first transistor and a source of the third transistor is coupled to the pixel signal line.

6. The imaging device according to claim 5, wherein the gate of the third transistor is coupled to a drain of the third transistor.

7. The imaging device according to claim 5, wherein a bottom gate of the third transistor is coupled to the source of the third transistor.

8. The imaging device according to claim 5, the comparator further comprising:
a fourth transistor, wherein a drain of the fourth transistor is coupled to the pixel signal line and a source of the fourth transistor is coupled to a drain of the second transistor.

9. The imaging device according to claim 8, wherein a gate of the fourth transistor is configured to receive a bias voltage.

10. The imaging device according to claim 1, wherein the first terminal of the first transistor is a bottom gate of the first transistor that is connected to the second terminal of the first transistor, and the first terminal of the second transistor is a bottom gate of the second transistor that is connected to the second terminal of the second transistor.

11. The imaging device according to claim 1, wherein the pixel is disposed in a first substrate and the comparator is disposed in a second substrate which is bonded to the first substrate.

12. The imaging device according to claim 11, wherein the first substrate and the second substrate are electrically connected by a through silicon via.

13. The imaging device according to claim 11, wherein the first substrate and the second substrate are electrically connected by a direct bonding.

14. The imaging device according to claim 1, wherein
the first terminal of the first transistor is a gate of the first transistor,
the second terminal of the first transistor is a source of the first transistor,
the first terminal of the second transistor is a gate of the second transistor, and
the second terminal of the second transistor is a source of the second transistor.

15. The imaging device according to claim 1, further comprising
a comparator including a third transistor, wherein a first terminal of the third transistor is coupled to the pixel signal line and a second terminal of the third transistor is coupled to a power supply terminal.

16. The imaging device according to claim 15, wherein the first terminal of the third transistor is a drain of the third transistor, and the second terminal of the third transistor is a source of the third transistor.

17. A comparator comprising:
a first input configured to receive a pixel signal;
a second input configured to receive a reference signal;
a first transistor, wherein a first terminal of the first transistor is coupled to the reference signal generation circuit and a second terminal of the first transistor is coupled to the first input; and
a second transistor, wherein a first terminal of the second transistor is coupled to a drain of the first transistor and a second terminal of the second transistor is electrically connected to the first input.

18. The comparator according to claim 17, wherein the second terminal of the first transistor and the second terminal of the second transistor are configured to receive a voltage, the voltage corresponding to the pixel signal.

19. The comparator according to claim 17, comprising:
a third transistor, wherein a drain of the third transistor is coupled to the first input and a source of the third transistor is coupled to the drain of the first transistor.

20. The imaging device according to claim 19, wherein a gate of the third transistor is configured to receive a bias voltage.

21. The comparator according to claim 17, comprising:
a third transistor coupled to a power supply line.

22. The comparator according to claim 21, wherein the gate of the third transistor is coupled to a drain of the third transistor.

23. The comparator according to claim 21, wherein a bottom gate of the third transistor is coupled to the source of the third transistor.

24. The comparator according to claim 21, the comparator further comprising:
a fourth transistor, wherein a drain of the fourth transistor is coupled to the first input and a source of the fourth transistor is coupled to a drain of the second transistor.

25. The comparator according to claim 24, wherein a gate of the fourth transistor is configured to receive a bias voltage.

26. The comparator according to claim 17, wherein the first terminal of the first transistor is a bottom gate of the first transistor that is connected to the second terminal of the first transistor, and the first terminal of the second transistor is a bottom gate of the second transistor that is connected to the second terminal of the second transistor.

27. The comparator according to claim 17, wherein
the first terminal of the first transistor is a gate of the first transistor,
the second terminal of the first transistor is a source of the first transistor,
the first terminal of the second transistor is a gate of the second transistor, and
the second terminal of the second transistor is a source of the second transistor.

* * * * *